(12) United States Patent
Sharma et al.

(10) Patent No.: US 11,409,924 B2
(45) Date of Patent: Aug. 9, 2022

(54) MODELLING OPERATING ZONES FOR MANUFACTURING RESOURCES USING VIRTUAL MODEL AND GRAPHICS BASED SIMULATION

(71) Applicant: Dassault Systèmes Americas Corp., Waltham, MA (US)

(72) Inventors: Gaurav Kumar Sharma, Bengaluru Karnataka (IN); Anoop Kishor, Bengaluru Karnataka (IN)

(73) Assignee: DASSAULT SYSTÉMES AMERICAS CORP., Waltham, MA (US)

( * ) Notice: Subject to any disclaimer, the term of this patent is extended or adjusted under 35 U.S.C. 154(b) by 431 days.

(21) Appl. No.: 16/541,699

(22) Filed: Aug. 15, 2019

(65) Prior Publication Data
US 2021/0046651 A1   Feb. 18, 2021

(51) Int. Cl.
*G06F 30/20*   (2020.01)
*G05D 1/00*   (2006.01)

(52) U.S. Cl.
CPC ............ *G06F 30/20* (2020.01); *G05D 1/0038* (2013.01); *G05D 1/0044* (2013.01)

(58) Field of Classification Search
CPC . H01Q 1/1242; G06F 30/20; G06F 16/90344; G06F 30/398
See application file for complete search history.

(56) References Cited

U.S. PATENT DOCUMENTS 5,034,807 A * 7/1991 Von Kohorn ........... A63F 13/12
                                                                725/5
5,227,874 A * 7/1993 Von Kohorn ........... A63F 13/12
                                                                705/7.32
(Continued)

FOREIGN PATENT DOCUMENTS

CN        102239032 A    11/2011
DE       10320343 A1    12/2004
(Continued)

OTHER PUBLICATIONS

Lee et al., "Survey on the virtual commissioning of manufacturing systems," Journal of Computational Design and Engineering, 1(3), 213-222 (2014).
(Continued)

*Primary Examiner* — Thai Q Phan
(74) *Attorney, Agent, or Firm* — Hamilton, Brook, Smith & Reynolds, P.C.

(57) ABSTRACT

Embodiments are directed to methods and systems for automatically determining a resource layout. An example embodiment begins by obtaining data indicating a position and a task performed by each resource of a plurality of resources. Then, for each resource of the plurality, a respective zone on a plane of interest occupied by the resource is automatically determined using the obtained data indicating the position and the task performed by the resource. In turn, determined zones of two or more resources of the plurality of resources are automatically combined into a combined zone based upon criteria and a file, e.g., a CAD/CAM file, indicating a layout of the plurality of resources on the plane of interest is automatically created based upon the determined zones and the combined zone.

20 Claims, 23 Drawing Sheets

(56) References Cited

U.S. PATENT DOCUMENTS

| | | | |
|---|---|---|---|
| 5,697,844 A * | 12/1997 | Von Kohorn | G07F 17/3262 463/40 |
| 5,877,967 A | 3/1999 | O'Brien, Jr. | |
| 5,916,024 A * | 6/1999 | Von Kohorn | H04N 7/0806 463/40 |
| 6,360,193 B1 * | 3/2002 | Stoyen | G09B 9/003 703/17 |
| 7,685,254 B2 * | 3/2010 | Pandya | H04L 69/161 709/217 |
| 8,300,219 B1 * | 10/2012 | Gordin | H01Q 1/1242 356/139.05 |
| 8,717,552 B1 * | 5/2014 | Gordin | H01Q 1/1242 356/139.05 |
| 8,719,415 B1 * | 5/2014 | Sirota | H04L 67/10 709/221 |
| 9,789,610 B1 | 10/2017 | Watts | |
| 10,081,106 B2 | 9/2018 | Rublee et al. | |
| 10,755,227 B1 * | 8/2020 | Aggarwal | G05D 1/0274 |
| 2002/0073101 A1 * | 6/2002 | Stoyen | G09B 9/003 |
| 2005/0044228 A1 * | 2/2005 | Birkestrand | G06F 9/5072 709/213 |
| 2005/0204321 A1 * | 9/2005 | Izurieta | G06F 30/398 716/112 |
| 2011/0264266 A1 | 10/2011 | Kock | |
| 2012/0265104 A1 | 10/2012 | Menegon et al. | |
| 2016/0171102 A1 * | 6/2016 | Pandya | G06F 16/90344 707/712 |
| 2017/0235853 A1 | 8/2017 | Griswold et al. | |
| 2018/0121766 A1 * | 5/2018 | McCord | G06N 3/08 |

FOREIGN PATENT DOCUMENTS

| | | |
|---|---|---|
| JP | 2007317079 | 12/2007 |
| JP | 2019091374 | 6/2019 |
| WO | 2014036549 A2 | 3/2014 |
| WO | 2014154942 A1 | 10/2014 |

OTHER PUBLICATIONS

Todt et al., "Analysis and classification of multiple robot coordination methods," In Robotics and Automation, 2000. Proceedings. ICRA'00. IEEE International Conference on (vol. 4, pp. 3158-3163), IEEE, (2000).

Cheng et al., "Delaunay Mesh Generation," CRC Press, Taylor & Francis Group, (2013).

Wang et al., "Geometric modeling for swept volume of moving solids," IEEE Computer Graphics and Applications, 6(12), 8-17, (1986).

Lee et al., "Complete swept volume generation, Part I: Swept volume of a piecewise C1-continuous cutter at five-axis milling via Gauss map," Computer-Aided Design, 43(4), 427-441, (2011).

Liang et al., "Analytical shape computation of macromolecules: I. Molecular area and volume through alpha shape," Proteins: Structure, Function, and Bioinformatics, 33(1), 1-17, (1998).

Hoffmann, "Geometric and Solid Modeling," (1989).

Amenta et al., "Surface reconstruction by Voronoi filtering," pp. 39-48 (1999).

Kirk, "Graphics Gems Series III," AP Professional, (1995).

International Organization for Standardization, "Robots and robotic devices—Safety requirements for industiral robots—Part 1: Robots," ISO 10218-1:2011 (Dec. 8, 2019).

Tay et al., "Optimising Robot Workcell Layout," Int'l J. Adv. Manuf. Tech., 12:377-378 (1996).

Nelson et al., "Practical Application of Robot Safety," (Oct. 2013).

Rossignac et al., "Oftseting operations in solid modelling," Computer Aided Geometric Design 3:129-148 (1986).

EP Search Report for EP 20 19 1038 titled "Modelling Operating Zones For Manufacturing Resources Using Virtual Model and Graphics Based Simulation" dated Dec. 11, 2020.

Piegl, et al., "The NURBS Book," 2nd Edition, Springer, (1996).

* cited by examiner

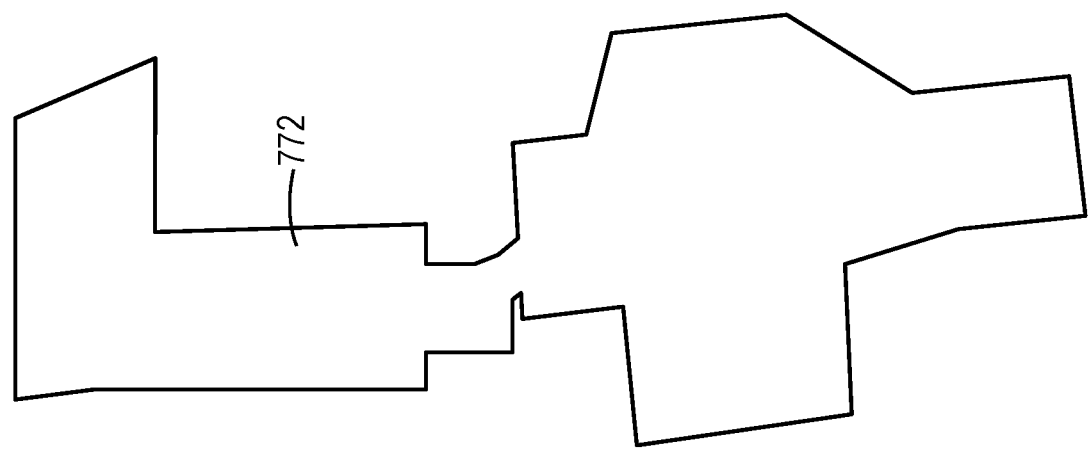
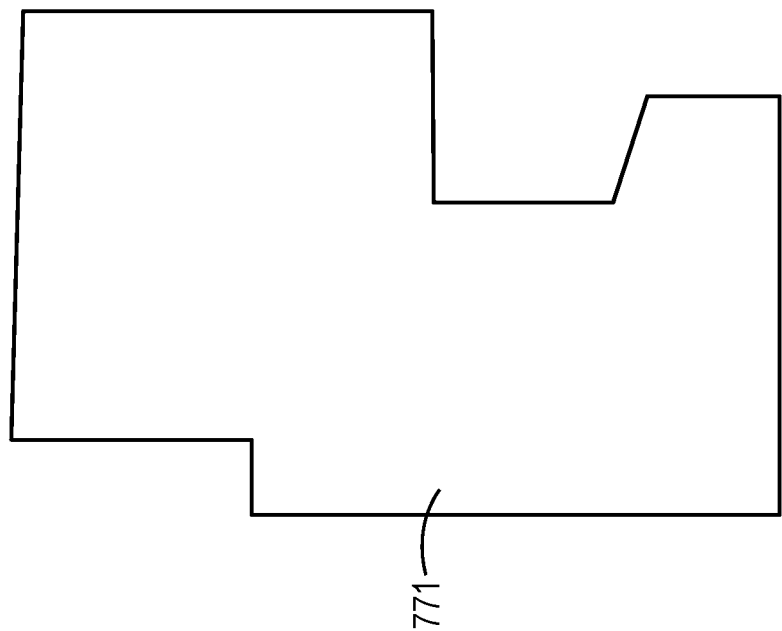
FIG. 7

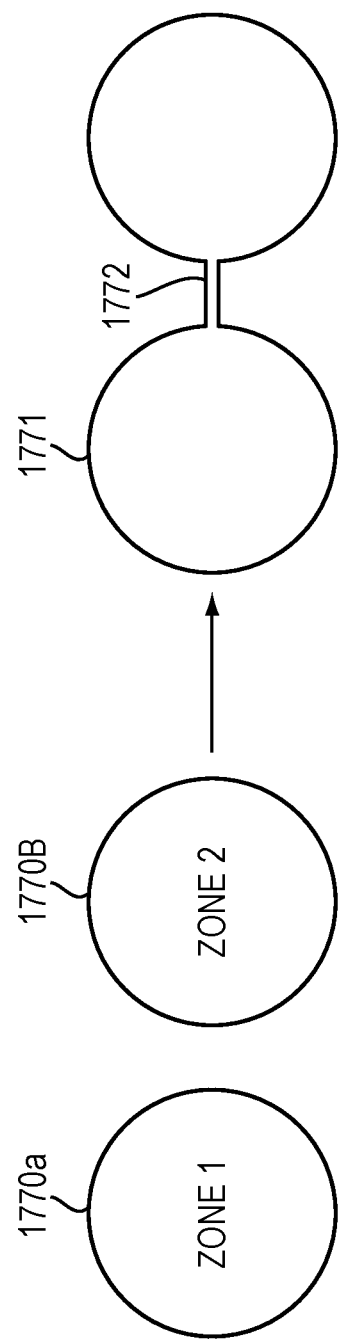

(VISION BASED SOLUTION)

(CONVENTIONAL SOLUTION)

MODELLING OPERATING ZONES FOR MANUFACTURING RESOURCES USING VIRTUAL MODEL AND GRAPHICS BASED SIMULATION

FIELD OF INVENTION

Embodiments relate to improved functionality for three-dimensional (3D) computer graphic modeling and simulation, task definition for resources, layout of resources, manufacturing resource planning, and offline programming.

BACKGROUND

A number of systems and programs are offered on the market for the design of parts, the design of assemblies of parts, 3D computer graphic modeling and simulation, task definition for resources, layout, manufacturing resource planning, and offline programming. These Computer-Aided Design (CAD) systems allow a user to construct and manipulate complex three-dimensional models of objects or assemblies of objects. CAD systems thus provide a representation of modeled objects using edges or lines, in certain cases with faces. Lines, edges, faces, or polygons may be represented in various manners, e.g., non-uniform rational basis-splines (NURBS).

These CAD systems manage parts or assemblies of parts of modeled objects, which are mainly specifications of geometry. In particular, CAD files contain specifications, from which geometry is generated. From geometry, a representation is generated. Specifications, geometry, and representations may be stored in a single CAD file or multiple CAD files. CAD systems include graphic tools for representing the modeled objects to the designers; these tools are dedicated to the display of complex objects. For example, an assembly may contain thousands of parts. A CAD system can be used to manage models of objects, which are stored in electronic files.

The advent of CAD and CAE systems allows for a wide range of representation possibilities for objects. One such representation is a finite element model (FEM). The terms finite element analysis (FEA) model, FEM, finite element mesh, and mesh are used interchangeably herein. A FEM typically represents a CAD model, and thus, may represent one or more parts or an entire assembly. A FEM is a system of points called nodes which are interconnected to make a grid, referred to as a mesh.

A FEM may be programmed in such a way that the FEM has the properties of the underlying object or objects that it represents. When a FEM, or other such CAD or CAE model is programmed in such a way, it may be used to perform simulations of the object that the model represents. For example, a FEM may be used to represent the interior cavity of a vehicle, the acoustic fluid surrounding a structure, and any number of real-world objects (physics-based systems) and other systems. When a given model represents an object and is programmed accordingly, it may be used to simulate the real-world object itself. For example, a FEM representing a stent may be used to simulate the use of the stent in a real-life medical setting.

CAD, CAE, and FEM models may be used to improve the design of the objects and environments that the models represent. Design improvements may be identified through use of simulation and/or optimization techniques that run a series of simulations in order to identify changes to the design of the model and thus, the underlying object and/or environment that the model represents.

3D computer graphics based simulation is widely used to simulate manufacturing processes. 3D computer graphics models of industrial resources and simulation of their behavior allow users to model, optimize, and validate various manufacturing processes in a factory. Like the general engineering problems solved using FEM, plant design, e.g., the layout design of industrial resources, is very complex, and modelling and simulation technology provide methods to iteratively arrive at solutions to these complex design problems. Moreover, the determined simulation programs can, in turn, be downloaded to the computers in the factory, which are used to drive the resources of the factory.

Such Off-Line Programming (OLP) systems, equipped with graphics based simulation functionality, are also known for the ability to quickly adapt to changes in the manufacturing environment because of the reduced computation effort during the real commissioning stage.

Planning of the layout design of the manufacturing resources is an important aspect to optimize the performance, spatial conservation of the factory floor space, and ergonomics point of view. Such planning typically uses the prior engineering knowledge of the layout designer rather than using the actual space occupied by operating zones of the manufacturing resources and relationships across the resources in the context of the manufacturing process. As a result, the use of the factory floor is inefficient. Further complicating the layout design is the fact that changes in layout due to the changes in manufacturing environment (new resources, process etc.) are very complex.

OLP systems equipped with graphics models of resources and graphics based simulation is a promising approach to overcome such limitations. Such systems allow the user to capture various industrial resources using graphical models, and various movements of these resources are captured using task based graphic simulation. This application needs new software tools to define operating zones of the resources on a given plane of interest, e.g., factory floor, to capture the relationship across these resources in context to a process, and to edit these operating zones by changing their topology. Such tools should also allow the user to make changes using high-level user inputs because the number of resources used in a factory can be very large.

SUMMARY

Embodiments provide functionality for resource layout and environment planning. One such embodiment defines the operating zone for a given task for a resource on a given plane. An embodiment constructs a two-dimensional virtual representation by projecting a solid model of each kinematic chain of a resource on a given plane and applying Boolean set operations as a part of a simulation of a task. Embodiments improve efficiency by performing the Boolean set operation in two-dimensions.

According to an embodiment, a user can identify the set of zones corresponding to the resources that can be combined based on proximity information. The novel geometric operator developed may use Hausdorff distance (maximum of minimum distances) in conjunction with subsequent dilation and erosion of the zone to alter the topology of the zones which represent the combined operating zones.

The representation of the operating zones on the plane of interest is far more efficient, compact, and intuitive, i.e., easy to use, compared to existing 3D swept volume based methods. Advantageously, this representation is equipped with geometric operators that allow combining the complex and irregular operating zones automatically with minimal deviation from the original shape of the individual zones. Existing methods do not provide such functionality.

An embodiment is directed to a computer-implemented method for automatically determining a resource layout. In particular, the method begins by obtaining data indicating a position and a task performed by each resource of a plurality of resources. Then, for each resource of the plurality, a respective zone on a plane of interest occupied by the resource is automatically determined using the obtained data indicating the position and the task performed by the resource. In turn, determined zones of two or more resources of the plurality of resources are automatically combined into a combined zone based upon criteria. Next, a work or output file, e.g., a CAD/CAM file, indicating a layout of the plurality of resources on the plane of interest is automatically created based upon the determined zones and the combined zone. According to an embodiment, the layout is in a real-world work area. In an example embodiment, the obtaining, determining, combining, and creating are automatically performed by a processor in response to a user command. Further, according to another embodiment, creating the work/output file may include the processor providing the created file in an electronically shareable manner. Moreover, the work/output file can provide a display view (graphical or model representation) to the user, or can serve as a data file that is shareable with pertinent related software, e.g., a controller for factory floor elements, such as robots. In such an embodiment, the created work/output file may implement control of factory resources to move and/or operate in accordance with the determined layout.

According to an embodiment, determining a respective zone for the resource includes: (1) simulating the resource performing the task indicated in the obtained data for the resource, (2) projecting components of the resource over time to produce closed contours of the resource on the plane of interest, and (3) combining the contours into the zone using a regularized Boolean set operation. Another embodiment further includes indicating safety zones in the layout. In such an embodiment, the safety zones may be indicated in the work/output file. Further, the safety zones may be determined based upon a user specified safety margin and/or the determined zones and combined zone.

In yet another embodiment, combining the determined zones of the two or more resources includes determining an optimally sized zone encompassing the zones of the two or more resources where the optimally sized zone is the combined zone. In such an embodiment, determining the optimally sized zone includes expanding and eroding the zones of the two or more zones using a first factor and a second factor to form the optimally sized zone. According to an embodiment, the expanding and eroding includes: (i) expanding the zones of the two or more zones using the first factor to form expanded zones, (ii) combining the expanded zones to form a super-zone, and (iii) eroding the super-zone using the second factor to form the optimally sized zone. In an embodiment, the first factor and the second factor are each a function, e.g., a distance function, of a maximum from a set comprising minimum distances between the two or more zones.

In another embodiment of the computer-implemented method, the criteria includes a negative offset value. Such an embodiment may further comprise determining a plurality of respective combined zones by combining the determined zones of the two or more resources using a plurality of different negative offset values and selecting, based upon a safety factor, a given combined zone from the determined plurality of combined zones for creating the file indicating the layout.

Embodiments may utilize any variety and combination of criteria to combine zones. Example criteria include at least one of: distance between zones, a user defined constraint, and a task performed by a resource of the two or more zones. In an embodiment, the distance between zones includes a lower limit and an upper limit for the distance between zones to be combined.

In yet another embodiment, the combining based on the criteria includes selecting, from the determined zones, candidate zones of the two or more resources for combining based on at least one of the criteria. In such a particular embodiment, the criteria are applied to the candidate zones to identify the determined zones of the two or more zones to combine and the identified zones of the two or more zones are combined into the combined zone. Further, in such an embodiment, the user defined constraint may include inclusion of a particular zone into the candidate zones.

Embodiments may determine layouts for any type of resources known in the art and similarly, may determine layouts for any type of planes of interest known in the art. According to an embodiment, a given resource of the plurality of resources is at least one of: an industrial resource, a robot, a human, a machine tool, and a fixture. In another embodiment, the plane of interest is a factory floor.

Another embodiment is directed to a system, e.g., a computer-based system, for automatically determining a resource layout. The system includes a processor and a memory with computer code instructions stored thereon, that cause the system to determine a resource layout as described herein. The system may be configured to implement any embodiments or combination of embodiments described herein.

In an example embodiment, the system is configured to obtain data indicating a position and a task performed by each resource of a plurality of resources. Using the obtained data, the system, for each resource of the plurality, automatically determines a respective zone on a plane of interest occupied by the resource. The system is further configured to combine, automatically based upon criteria, determined zones of two or more resources of the plurality of resources into a combined zone and automatically create a work or output file indicating a layout of the plurality of resources on the plane of interest based upon the determined zones and the combined zone. Further, in an embodiment, creating the work/output file may include providing the created file in an electronically shareable manner. Further, the work/output file can provide a display view (graphical or model representation) to the user, or can be a data file that is shareable with pertinent related software or hardware, e.g., a controller for factory floor elements, such as robots. In such an embodiment, the work/output file may implement control of factory resources to move and/or operate in accordance with the determined layout.

Another embodiment of the present invention is directed to a cloud computing implementation for automatically determining a resource layout. Such an embodiment is directed to a computer program product executed by a server in communication across a network with one or more clients, where the computer program product comprises a computer readable medium. In such an embodiment, the computer readable medium comprises program instructions, which, when executed by a processor, causes the processor to obtain data indicating a position and a task performed by each resource of a plurality of resources and, for each resource of the plurality, automatically determine a respective zone on a plane of interest occupied by the resource using the obtained data indicating the position and the task performed by the resource. Further, the executed computer program product (program instructions thereon) causes the processor to combine, automatically based upon criteria, determined zones of two or more resources of the plurality of resources into a combined zone and automatically create a work or output file indicating a layout of the plurality of resources on the plane of interest based upon the determined zones and the combined zone. Further, in an embodiment, creating the work/output file may include providing the created file in an electronically shareable manner. Further, the work/output file can provide a display view (graphical or model representation) to the user, or can be a data file that is shareable with pertinent related software or hardware. In such an embodiment, the work/output file may implement control of factory resources to move and/or operate in accordance with the determined layout.

It is noted that the method, system, and cloud computing embodiments may perform any embodiments or combination of embodiments described herein.

Yet another embodiment is directed to a computer-implemented method of determining a combined industrial work zone encompassing a plurality of resources. Such an embodiment, in response to user interaction with a CAD model representation of a subject real-world work area, obtains data indicating a plurality of zones in the subject real-world work area. In such an embodiment, each zone is occupied by a resource and obtaining the data is implemented by a digital processor. The method continues with the processor receiving a user defined distance criteria for combining two or more zones of the plurality of zones. In turn, using the obtained data indicating the plurality of zones, the processor automatically determines minimum distances between each zone of the plurality of zones. Next, from the plurality of zones, the processor automatically identifies candidate zones for merging based on the determined minimum distances between each zone and the user defined distance criteria. In an embodiment, said automatically determining and automatically identifying is performed by the processor in response to user input of the user defined distance criteria. To continue, the processor connects the identified candidate zones by dilating the candidate zones using a first factor and by contracting the connected candidate zones using a second factor. In this way, the processor determines a combined zone. According to an embodiment, determining the combined zone includes the processor providing an output indication of the determined combined zone. This output indication can be a display view (graphical or model representation) to the user, or can be a data file that is shareable with pertinent related software, e.g., a controller for factory floor elements, such as robots.

According to an embodiment, the first factor and second factor are each a function, e.g., a distance function, of a maximum from a set comprising determined minimum distances between the candidate zones. Another embodiment further comprises receiving a user defined connectivity factor and, in such an embodiment, the first factor is a function of a maximum from a set comprising determined minimum distances between the candidate zones and the received user defined connectivity factor. An example embodiment further comprises receiving one or more user defined constraints on zones to be combined and identifying the candidate zones for merging based on the determined minimum distances between each zone, the user defined distance criteria, and the received one or more user defined constraints on zones to be combined.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

FIG. 7 is a plan view of the operating zones depicted in FIG. 5 combined using principles of an embodiment.

FIG. 17 graphically depicts a process of combining zones according to an embodiment.

DETAILED DESCRIPTION

Figure 1:
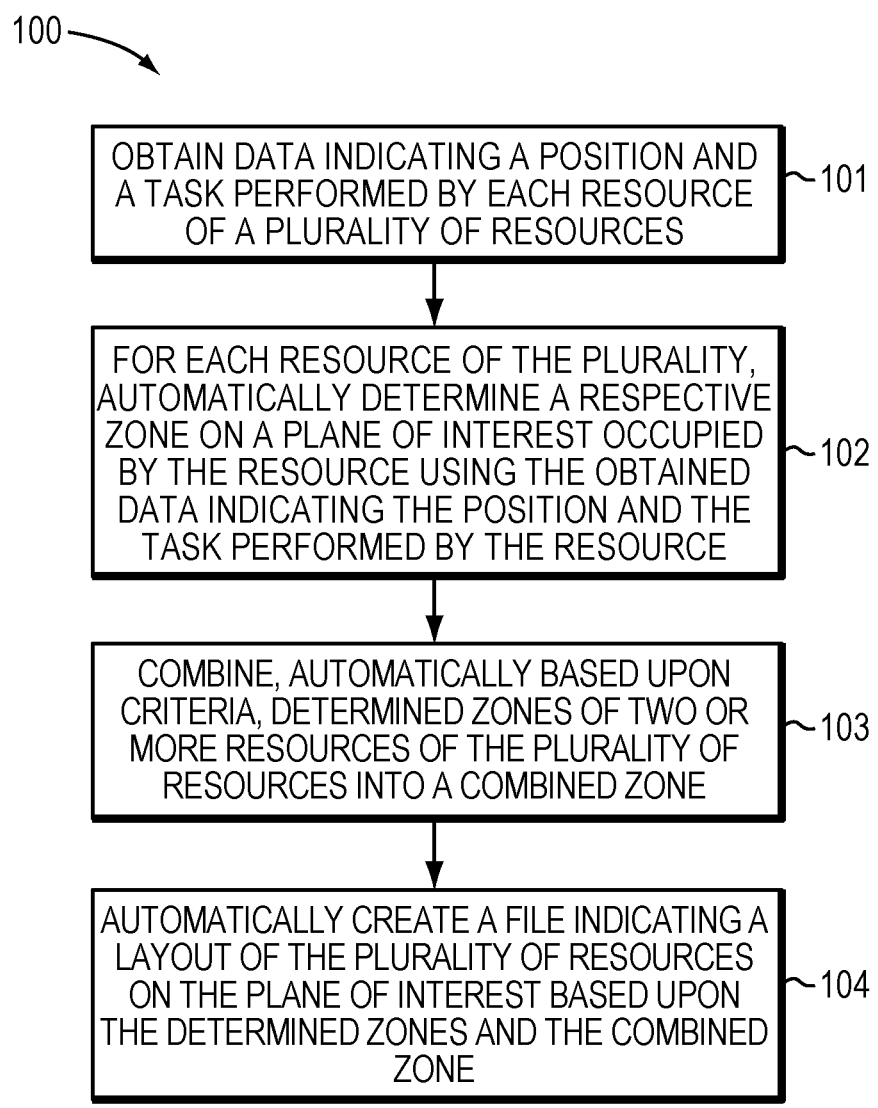
FIG. 1 is a flowchart of a method for determining a resource layout according to an embodiment.

A description of example embodiments follows.

The teachings of all patents, published applications, and references cited herein are incorporated by reference in their entirety.

Currently, three-dimensional (3D) computer graphics based simulations of manufacturing work-cells are widely used to model, optimize, and validate the behavior of resources based on task assignments. Offline programming systems translate the simulated program into the native code of the robot, Numerical Control (NC) machines etc., which run the actual manufacturing systems. OLP systems (equipped with graphics simulators) support the manufacturing system to be more flexible by providing the fast adaption of new programs, reduced debugging, and correction efforts during the real commissioning stage [Lee et al., Survey on the virtual commissioning of manufacturing systems. *Journal of Computational Design and Engineering*, 1(3), 213-222 (2014)]. New configurations of a work-cell for newly defined tasks that support changing production environments can be adapted to cope with changes in the product quality or quantity or for advanced tools or processes. These modern systems thus support changing resource layouts and it is beneficial to determine optimized resource layouts in environments. Embodiments advantageously provide this functionality of resource layout optimization (based on floor space, safety constraints, and the like).

In a manufacturing system, resources can be classified as active, e.g., robots, humans, and machine tools, or passive, e.g., products and fixtures. Defining the operating zones on a given plane, e.g., factory floor, for a resource is an important aspect for layout design to optimize the performance, spatial conservation of the floor space, and safety factors [ISO 10218-1:2011, US20110264266A1, CN102239032B, WO2014036549A3, U.S. Pat. No. 9,789,610B1, US10081106B2].

The computation of the operating zones for resources, e.g., robots, is a higher-dimensional problem [Todt et al., Analysis and classification of multiple robot coordination methods, In *Robotics and Automation*, 2000. *Proceedings. ICRA '00. IEEE International Conference on* (Vol. 4, pp. 3158-3163), IEEE, (2000)]. Thus, most of the methods employed in industry use either heuristic methods [Ngoi & Tay, Int J Adv. Manuf. Technol. (1996) 12: 377. https://doi.org/10.1007/BF01179814] or prior engineering knowledge to evaluate these zones. As a result, the operational zone is not exact with respect to the task definition assigned to the resource. This results in an inefficient use of floor space.

Further, definition of the operating zone can be process dependent. For example, a robot engaged in a spraying application needs more floor space compared to a robot engaged in assembly. Sometimes, an operating zone should be composite in nature, where two or more resources interact with each other. For example, if a robot is holding a plate, which is being welded at different spots by another robot, these two robots need to be in a single zone because they share the same process. Moreover, these operating zones need to accommodate the access and delivery of products across the stations. Thus, it is important to consider the relationship across the resources when combining the corresponding operating zones for layout planning or the creation of safety zones. These applications need new software tools which allow the user to define the representation of the operating zone and edit the zones by changing the zone topology or morphology using high level inputs from a user. Embodiments provide this functionality and thus user-interactive flexibility in representing zones.

The idea of configuring space for a resource, e.g., a robot (or mechanism), or configuring composite spaces for multiple resources has been used for various applications such as collision detection and energy expenditure, amongst other examples. The configuration space is a higher dimensional problem [Todt et al., Analysis and classification of multiple robot coordination methods, In *Robotics and Automation*, 2000. *Proceedings. ICRA '00. IEEE International Conference on* (Vol. 4, pp. 3158-3163), IEEE, (2000)]. Various postures assumed by a resource in CAD systems while executing a task can be captured by using the geometric and solid modelling tools. Such tools allow each kinematic chain to be modeled as a moving solid, or swept volume (which results from the moving solid) [Wang et al., Geometric modeling for swept volume of moving solids, *IEEE Computer graphics and Applications*, 6(12), 8-17, (1986); Lee et al., Complete swept volume generation, Part I: Swept volume of a piecewise C1-continuous cutter at five-axis milling via Gauss map, *Computer-Aided Design*, 43(4), 427-441, (2011)].

Generation of the swept volume is the general method to capture the operating space of a resource for a given task. However, the swept volume method is not advantageous because it is computationally expensive to determine three-dimensional sweeping of the kinematic chain as a function of time and apply Boolean set operations over the 3D swept discrete elements. Also, the resulting size of the representation is very large, so it is difficult to be used for other purposes, such as editing or querying for the bounded area. Also, it is intuitive and easier for users to work on 2D data rather than that 3D data obtained by swept volume. Further, while a 3D swept volume could be projected on a 2D plane for use as an operating zone so as to improve usability, such a method would still require the use of the computationally expensive 3D swept volume.

When designing a resource layout, once the respective operating zone is defined for each of the resources, the layout planner places the resources optimally based on various factors, such as, relationship between resources (coordinating the same task) and proximity information, amongst other examples. As a result, the layout of operating zones can have a complex irregular shape. It is important to minimize deviation between zones being combined and the combined zone in order to maximize the use of floor space. Existing methods do not provide a software tool to automate the definition of the composite operating zones by altering the topology of the zones based on proximity information (user-defined relation between the resources), which can be used to trace the safety zone or design the layout of the work-cell.

One might consider the possibility of capturing the operating zones by projecting the points on the kinematic chain on the plane of interest and using an existing reconstruction algorithm [Liang et all, Analytical shape computation of macromolecules: I. Molecular area and volume through alpha shape, *Proteins: Structure, Function, and Bioinformatics*, 33(1), 1-17, (1998); Amenta et al., "Surface reconstruction by Voronoi filtering", pages 39-48 (1999)]. However, the accuracy of such a reconstruction method depends on high sampling density of the points, which may not be practically possible. In addition, there exists a risk of getting an empty space (representing the non-operating zone) where point density is sparse. This might result in pinch zones while using resources like robots, which is detrimental from an ergonomics and safety point of view.

Embodiments solve these problems. FIG. 1 is a flowchart of a computer-implemented method 100 for automatically determining a resource layout according to an embodiment. The method 100 is computer implemented and may be performed via any combination of hardware and software as is known in the art. For example, the method 100 may be implemented via one or more processors with associated memory storing computer code instructions that cause the processor to implement steps 101, 102, 103, 104 of the method 100.

The method 100 begins at step 101. For each resource in a plurality of resources, the processor (step 101) obtains data indicating a position and a task performed by the resource. The obtained data may be in any computer readable form that indicates the position and task of a resource. For example, an obtained virtual model for a resource can be a CAD model represented using a boundary representation [Christoph M. Hoffmann, Geometric and solid modeling: an introduction, Morgan Kaufmann Publishers Inc., San Francisco, CA, 1989] or a mesh representation [Shewchuk, Jonathan, Tamal K. Dey, and Siu-Wing Cheng. Delaunay mesh generation. Chapman and Hall/CRC, 2016]. This obtained CAD model may include an indication of the position of the resource. Further, a task associated with the resource can be defined as a linear sequence of activities describing how a resource moves to a target position. In such an embodiment, the kinematic chains that form a virtual resource are given by:

$$Q=\{qi\}_{i=1}^{N} \tag{1}$$

where N is the total number of chains.

Further, a task is defined by the set of targets represented as a Joint target or Cartesian target. Each target is written as $(x,y,z,\alpha,\beta,\gamma)$, where x,y,z represents the position, and $\alpha,\beta,\gamma$ represents the roll, pitch, yaw $\alpha,\beta,\gamma$. Thus, each task is written as a set of targets:

$$T=\{ti\}_{i=1}^{M} \tag{2}$$

Where M is the total number of targets and each target $ti=(x, y, z, \alpha, \beta, \gamma)$.

The CAD model corresponding to each chain qi can be written as S(qi), which stores the geometric information of the chain written as a set of vertex V, edge E, and face F.

$$S(qi)=(V,E,F) \tag{3}$$

Because the method 100 is computer implemented, the data obtained at step 101 may be obtained from any point, e.g., computing or storage device, capable of communicating with the computer device implementing the method 100.

Next, at step 102, for each resource of the plurality, the processor uses the obtained data indicating the position and the task performed by the resource and automatically determines a respective zone on a plane of interest occupied by the resource. In an embodiment, the zone of a resource may be determined as described hereinbelow in relation to FIG. 13.

According to an embodiment, determining a respective zone for each resource at step 102 includes: (1) simulating the resource performing the task indicated in the obtained data for the resource, (2) projecting components of the resource over time to produce closed contours of the resource on the plane of interest, and (3) combining the contours into the zone using a regularized Boolean set operation. In an example, at step 102, during simulation (1), each chain qi moves to a new posture corresponding to the given target. If the moving chain qi is written as qi(t) as a function of time, then the CAD model corresponding to such moving chain can be written as S(qi(t)) as noted above in relation to equation (3). For a given plane P, the CAD model of the chain at an instant is projected.

$$Sp(qi)=Proj(S(qi),P) \tag{4}$$

Sp(qi) is the projected contour on the plane P. Projecting all such contours for each chain over a period of time of task execution results in a set of intersecting contours written as ISp.

$$ISp=\{\{Sp(qi(t))\}_{i=1}^{N}\}_{t=0}^{T} \tag{5}$$

Figure 13:
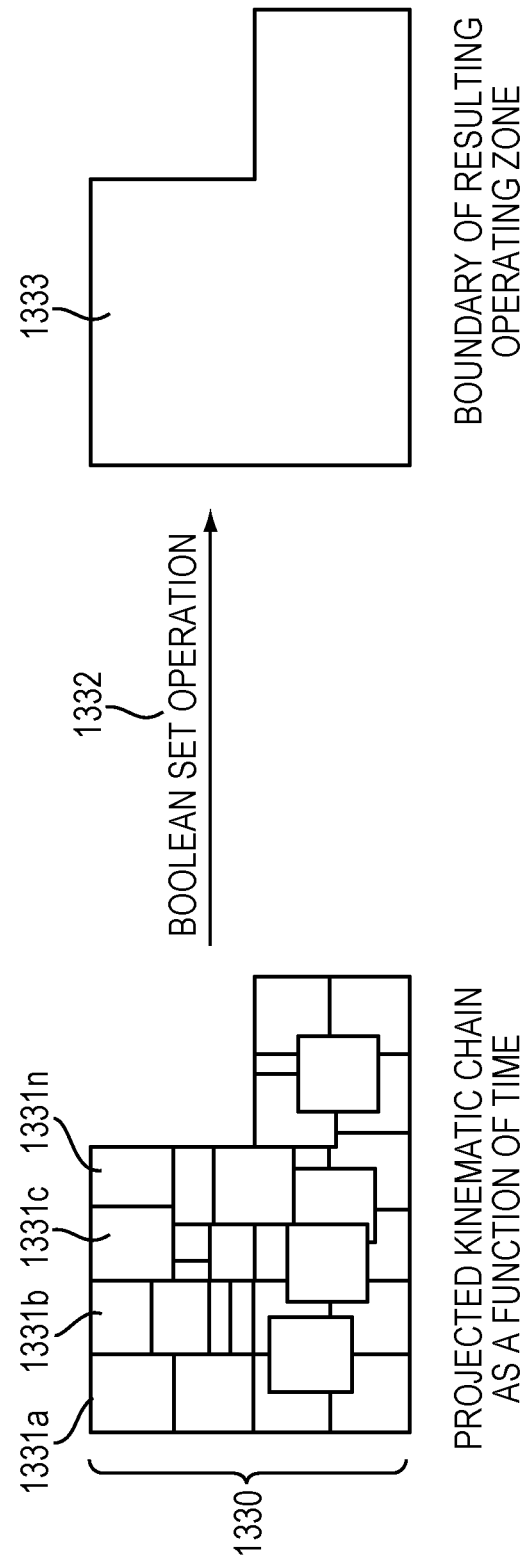
FIG. 13 graphically depicts the combination of contours used to create operating zones or virtual representations thereof according to an embodiment.

To illustrate, according to an embodiment, a set of intersecting contours 1330 is depicted in FIG. 13. In an embodiment, to combine the contours, a regularized Boolean set union operation is applied to all the elements of set ISp in equation 5 to get 2D operating zone OZ.

$$OZ=\{\{U^*Sp(qi)\}_{i=1}^{N}\}_{t=0}^{T}=(Vp,Ep,Fp) \tag{6}$$

The resulting operating zone OZ is a set of vertices, edges and faces. To be noted, this set would not have any intersecting edges or faces as shown by the operating zones 1333 in FIG. 13. In turn, at step 103, the processor combines the determined zones of two or more resources of the plurality of resources into a combined zone based upon criteria. Further, in another embodiment, multiple combined zones may be determined. To illustrate, if there are resources A, B, C, and D, in an embodiment, one combined zone may include the operating zones corresponding to the resources A and B and a second combined zone may include the operating zones corresponding to the resources C and D. According to an embodiment, combining the determined zones of the two or more resources at step 103 includes determining an optimally sized zone encompassing the zones of the two or more resources where the optimally sized zone is the combined zone. In such an embodiment, determining the optimally sized zone includes expanding and eroding the zones of the two or more resources using a first factor and a second factor to form the optimally sized zone. In such an embodiment, the expanding and eroding includes: (i) expanding the zones of the two or more resources using the first factor to form expanded zones, (ii) combining the expanded zones to form a super-zone, and (iii) eroding the super-zone using the second factor to form the optimally sized zone.

Figure 14:
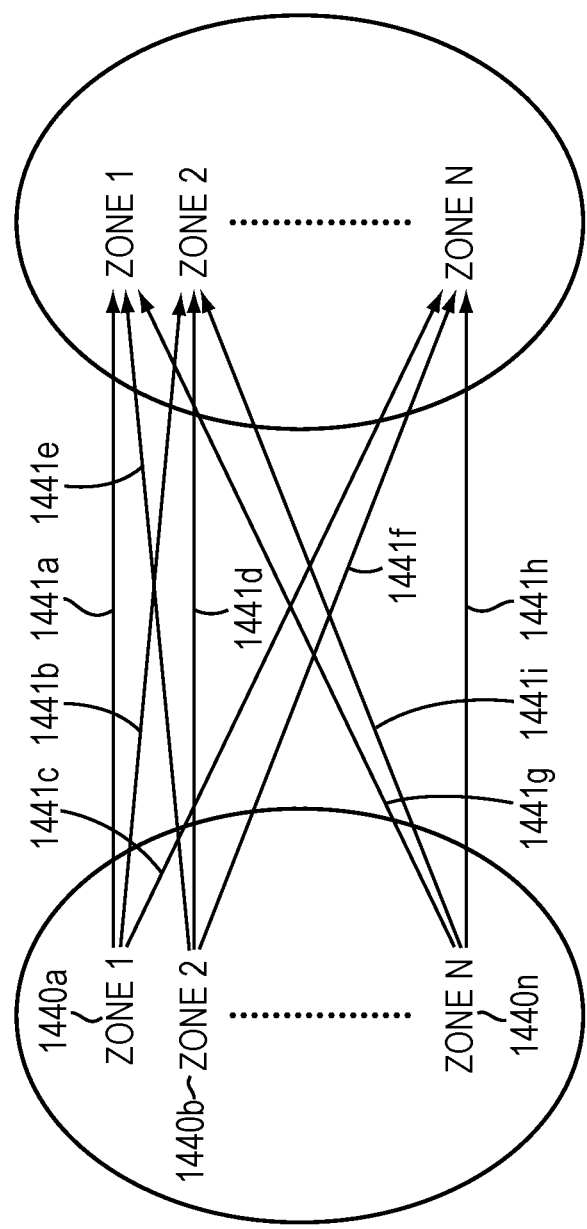
FIG. 14 depicts evaluated distances between zones that may be used in combining zones.

Below is an example of performing the combining at step 103. In such an example, the input is operating zones of resources A, B, C, and D to be combined and the output is a single combined zone. Let the operating zone OZ corresponding to the operating zone of resources A, B, C and D be OA, OB, OC and OD respectively. Let set S1 and S2 contain all four operating zones. Find the maximum of minima distance between set S1 and S2.

$$dist(S1,S2)=\max(dist(a,b)) \tag{7}$$

where $a \in S1$, $b \in S2$, dist(a, b) is the minimum distance between two zones a, b belonging to set S1 and S2 respectively. Find the maximum of minima distance between set S1 and S2. For example, FIG. 14 shows minimum distance between each element of set S1 and S2 labelled as 1441a-i. The maxima of these minimum values are used in the next step. Further detail for an offset operation that may be employed in an embodiment is described in Rossignac, Jaroslaw R., and Aristides A G Requicha. "Offsetting operations in solid modelling," Computer Aided Geometric Design 3.2 (1986): 129-148.

To continue this example of combining zones at step 103, all the operating zones are expanded using regularized positive offset r to all zones:

$$OZNew = OZ \uparrow * r = \{p : \exists q \in OZ, |p - q| \le r\} \quad (8)$$

where $$r > dist(S1, S2)/2 \text{ or } r = \frac{dist(S1, S2)}{2} + \varepsilon,$$

$\in$ can have a very small value. Zone OZ can be OA, OB, OC, OD. The result of the offset in equation 8 is OAexpanded, OBexpanded, OCexpanded, ODexpanded. Next, the expanded zones obtained using equation 8 are combined using regularized Boolean Set Operation to form a super zone SOZ.

$$SOZ = \{OAexpanded \; U^* \; OBexpanded \; U^* \; OCexpanded \; U^* \; ODexpanded\} \quad (9)$$

In turn, the super zone SOZ in equation 9 is eroded by applying regularized negative offset r by not considering $\varepsilon$ value.

$$SOZ \downarrow * r = c^*((c^*SOZ) \uparrow * r) \quad (10)$$

Where $c^*$ is the regularized complement, $$r \le \frac{dist(S1, S2)}{2}.$$

According to an embodiment, the first factor and the second factor are each a function, e.g., a distance function, of a maximum from a set comprising minimum distances between the two or more zones. In an embodiment, the first factor is $D_{maxmin}/2+\varepsilon$, where $\varepsilon$ is very small compared to $D_{maxmin}$, for example, ($\varepsilon/D_{maxmin}=0.0001$) and $D_{maxmin}$ is a maximum value from a set of minimum distances between the zones being combined. Further, in an embodiment, the second factor is $D_{maxmin}/2$. According to an embodiment, $\varepsilon$ represents the connectivity factor, which is internally used to connect two or more zones during expansion. Moreover, in embodiments the second factor may be chosen by a user, as long as the second factor is smaller than the first factor. Further, in embodiments, the first factor and second factor may be set to default values.

In another embodiment of the method 100, at step 103, a plurality of respective combined zones are determined by varying the criteria used to combine the zones. Then, in such an embodiment, a given combined zone from the determined plurality of combined zones is selected. In such an embodiment, the combined zone may be selected based upon a safety criteria. To illustrate, consider an example where the criteria includes a negative offset value. In such an embodiment, a plurality of different negative offset values are used and, for each different negative offset value, a different combined zone is determined. Then, one combined zone is selected from among the plurality of different combined zones.

In yet another embodiment, the combining based on the criteria at step 103 includes, from the determined zones, selecting, based on at least one of the criteria, candidate zones of the two or more resources for combining. In such a particular embodiment, the criteria are applied to the candidate zones to identify the determined zones of the two or more resources to combine and the identified zones of the two or more resources are combined to form the combined zone. Further, in such an embodiment, a criteria for identifying candidate zones may be a user defined constraint, such as, inclusion of a particular zone into the candidate zones. Then, criteria, such as distance, may be used to determine if the user included zone is combined with another zone.

Returning to FIG. 1, the method 100 concludes by the processor at step 104 automatically creating a work or output file indicating a layout of the plurality of resources on the plane of interest based upon the determined zones and the combined zone. In embodiments of the method 100, the work/output file created at step 104 may be in any computer readable form that stores representations of or otherwise indicates the layout of the plurality of resources. For instance, in an embodiment, the resulting output is a 2D CAD model represented as a set of vertices, edges, and faces (V, E, F). Alternatively, the resulting output may be a solid model. In an embodiment, the boundary of the 2D CAD model is extracted for construction of the layout, which is achieved by generating a set of closed poly-lines. The orientation of poly-lines forming the boundary (e.g., clockwise) would be opposite to the orientation of poly-lines forming internal holes (e.g., anti-clock wise). Further, in an embodiment, the extracting utilizes an appropriate step-size [Lindgren, Terence, Juan Sanchez, and Jim Hall. "Curve tessellation criteria through sampling." Graphics Gems III (IBM Version). Morgan Kaufmann, 1992. 262-265]. The work/output file indicates the positions and footprints of the combined zone(s) and any other operating zones that are not part of combined zone(s).

Further, in an embodiment, creating the file at step 104 may include providing the created file in an electronically shareable manner. In addition, the work/output file can provide a display view (graphical or model representation) to the user, or can be a data file that is shareable with pertinent related software or hardware, e.g., a controller, for factory floor elements, such as robots. In such an embodiment, the file may implement control of factory resources to move and/or operate in accordance with the determined layout.

Another embodiment of the method 100 further includes indicating safety zones in the layout. In such an embodiment, the safety zones may be indicated or otherwise represented in the work/output file created at step 104.

Embodiments of the method 100 may utilize any variety and combination of criteria to combine zones. Example criteria include at least one of: distance between zones, a user defined constraint, and a task performed by a resource of the two or more zones. In an embodiment, the distance between zones includes a lower limit and an upper limit for distance between zones to be combined.

Moreover, the method 100 may determine layouts for any type of resources known in the art and similarly, may determine layouts for any type of planes of interest known in the art. According to an embodiment, a given resource of the plurality of resources is at least one of: an industrial resource, a robot, a human, a machine tool, and a fixture. In another embodiment, the plane of interest is a factory floor.

Figure 2:
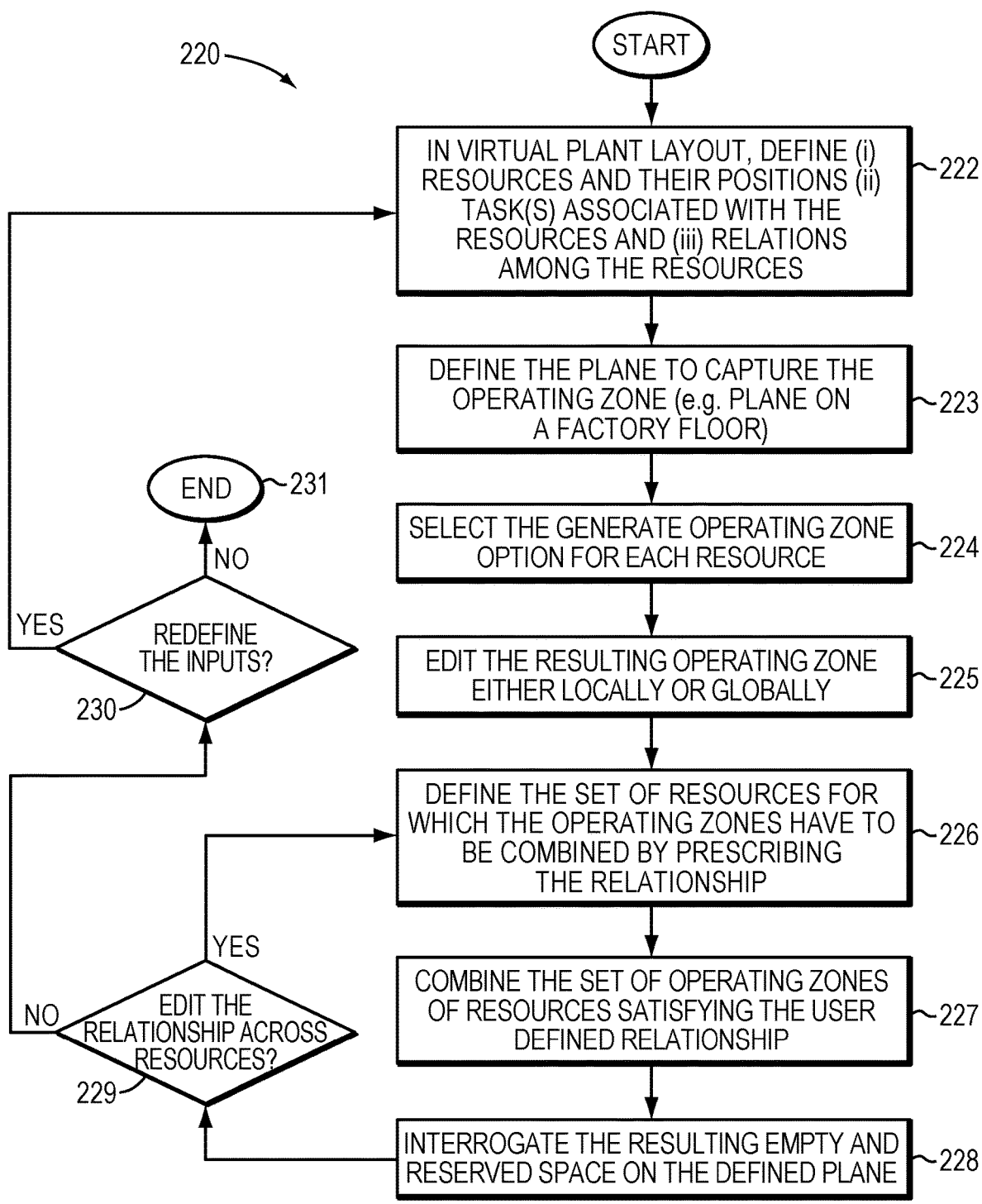
FIG. 2 is a flow diagram of an embodiment for determining a layout for resources.

FIG. 2 is a flowchart of a user-interactive process or method 220 for determining the layout of resources according to an embodiment. The method 220 starts 221 and receives user input at steps 222 and 223. Specifically, resources and their positions, one or more tasks associated with the resources, and relations among the resources are defined at step 222. The defined information may be in any form known in the art. For instance, in an example embodiment, the defining at step 222 is implemented through user interaction in Virtual Plant Layout, which is but one example of a plurality of CAD/CAM/CAE systems that may be utilized. In such an embodiment, Virtual Plant Layout models the real plant layout within a computer using various CAD models. The software tools are equipped with various user-interaction capabilities to help the user to design and edit the plant. It is noted that while Virtual Plant Layout is described, embodiments are not so limited and any variety of computer based software applications may be used. At step 223, the plane of the operating zone is defined, i.e., the shape and dimensions of the plane are provided by the user to the system 220. In an example where the resources are factory resources, the defining at step 223, defines the plane of the factory floor.

Using the input data from steps 222 and 223, the method step 224 generates a respective operating zone for each resource. In an embodiment, the operating zones are automatically generated at step 224 in response to the inputs at step 222 and 223. In an alternative embodiment, the operating zones are generated at step 224 in response to a user command, such as selection of a "generate operating zone" option. To continue, step 225 edits the operating zones generated at step 224. It is noted that step 225 is optional and is only carried out where editing is desired. In embodiments, editing may be desired after either generating operating zones or combining the set of operating zones to accommodate safety margins. The editing at step 225 may be local, i.e., individual operating zones for resources may be modified, or global, i.e., changes may be made to a plurality of the operating zones.

Next, at step 226, the relationship for combining operating zones of resources is user-interactively defined. In other words, at step 226 criteria are defined for combining operating zones. Example criteria include: distance between zones, a user defined constraint, and a task performed by a resource corresponding to an operating zone, amongst other examples. Further, it is noted that embodiments may utilize a plurality of criteria in combination and, thus, at step 226, the combination of criteria for combining operating zones may be defined. For instance, in an embodiment, a user may rank criteria used for combining in order of importance. To illustrate, if a user wants to combine a set of resources based on two criteria: (a) sharing the same manufacturing process, and (b) distance criteria, then, the user can rank the preferred order with which the criteria are used, e.g., prefer (a) over (b). In such an example, first a combined zone for resources sharing a process is determined. Then, the distance criteria are applied to combine zones outputted from the first step (combining resources sharing a process). It is noted that by altering ranking from (a) to (b) or (b) to (a), different results can be obtained.

According to an embodiment, defining the relationship between operating zones at step 226 may be done based upon user input. For example, a user may indicate or otherwise prescribe that any operating zones within 1 foot of each other should be combined. In an embodiment, the set of operating zones corresponding to each resource obtained using equation (6) is encapsulated using vertices and their relationships with other resources is encapsulated as edges to form a graph structure G of vertices and edge (v, e).

$$G=(v,e) \quad (11)$$

Figure 4:
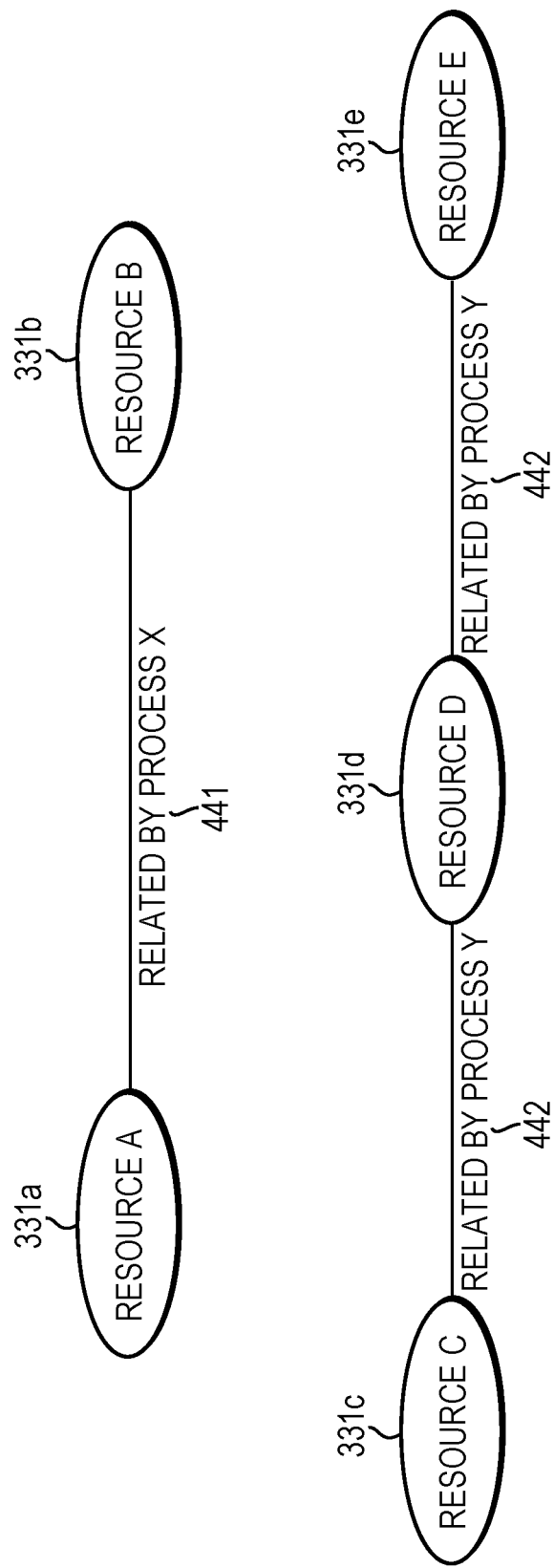
FIG. 4 is a simplified diagram illustrating relationships between the resources of FIG. 3 that may be considered when determining a layout as described herein.

To illustrate, FIG. 4 described in further detail below, shows resource A, B, C, D, and E denoted by vertices labelled as 331$a$, 331$b$, 331$c$, 331$d$, and 331$e$, which contains the representation of corresponding operating zones OZ. The relationship between these resources is denoted by the edges 441 and 442.

To continue, at step 227, the system/method 220 combines the set of operating zones of resources that satisfy the relationship defined in step 226. According to an embodiment, step 227 includes filtering the set of resources and their corresponding zones (captured as vertices in equation 11) which satisfy a user-defined relationship (captured as edges in equation 11). These filtered zones can then be combined as described herein. Further, it is noted that in an embodiment, after step 227, the method may return to steps 225 and/or 226 to edit operating zones or relationships across resources.

In turn, at step 228, the method/system 220 interrogates the empty space and reserved space that remains after combining the zones at step 227. For instance, in an embodiment, interrogating the space at 228 identifies resulting space on the plane of interest that may be utilized or identifies free space that should be incorporated into a zone. In such an embodiment, the empty space can be re-used for other purposes such as storing inventory or for any other purpose.

Next step 229 determines whether the relationship between resources should be edited. The determination at step 229 may be informed by the interrogation performed at step 228. To illustrate, consider an example where zones that are 12 inches apart are combined. In such an example, this criteria leaves zone A and zone B being separated because they are 12.5 inches apart. Upon step 228 interrogating the free space, the method/system 220 identifies the 0.5 inch gap and determines that for safety considerations, the zones A and B should be combined. Based upon this determination, at step 229, the method 220 decides to edit the relationship between the zones and returns to step 226 where the relationship is changed so as to combine all zones that are 13 inches apart. In an embodiment, such functionality may be automatically implemented based upon safety criteria. For example, a safety criteria may be set that automatically combines any zones that are within a particular distance of each other.

If at step 229, the method does not edit the relationship amongst resources, the method 220 continues to step 230. At step 230, method/system 220 determines whether the inputs, e.g., resources and their positions, task(s) associated with resources, and relations amongst resources, amongst other examples, should be redefined. If they should be re-defined, the method returns to step 222 and if not, the method ends 231. Considerations for redefining the inputs include needing resources to perform a different task (e.g., robots were being used for welding but now need to be used for painting and assembly) or needing resources to perform a task with different inputs (e.g., assembly robots need to assemble item C and item D rather than, item A and item B).

In an embodiment of the method 220, the input at step 222 is the set of resources used in the factory, floor position of these resources, relationship among these resources (like resource A coordinates with resource B), and task definition associated with each resource. Further, an embodiment allows the user to trace the layout for the set of resources based on the relationships among them. Further, it is noted that the solution of the method 220, i.e., the combination of zones determined at step 227 i.e., the combined zone, can be iteratively refined by editing the relationship between resources (at step 229 returning to step 226) and/or modifying inputs (at step 230 returning to step 222) until the solution converges to an optimal solution. In an embodiment, this can be automated by automating the process of task and relationship definition.

An embodiment of the present invention includes two parts. The first part includes the generation of operating zones for individual resources and the second part includes combining zones based on the user-defined relationships across the resources.

Creation of the Operating Zone

In an embodiment, an operating zone is created by virtual simulation of a task associated with a resource. The virtual simulation process may include selecting the task associated with the resource, defining the appropriate plane where the operating zone needs to be captured for the given resource, and performing an instance of the function "Generate Operating Zone". In an embodiment, the virtual simulation process creates and results in a two-dimensional closed contour around the resource on the given plane.

Editing the Operating Zone

In an embodiment, the generated operating zone respects the configuration space spanned by the resource for the task associated with the resource. However, a user may allocate additional space to compensate for any deviation in the real-time manufacturing systems by editing the operating zone either globally or locally. An example of global editing is a user prescribing an offset parameter on the operating zone to inflate the operating zone. An example of a local editing is a user moving control points associated with the operating zone to locally edit a region of interest of the operating zone.

Query the Operating Zone for various properties

Using a virtual representation of the operating zone, a user can query various geometric properties such as, area of the operating zone and girth of the operating zone, amongst other examples. A user can also compare zones to find answers to various queries such as finding the set of resources sharing the same floor, finding a set of similar zones, and/or finding symmetric zones. This information can be used to make edits to operating zones, amongst other examples. In general, operating zones can be queried for analysis purposes, such as, "What is the area occupied by a resource?" or "Can a smaller robot perform the same task?" amongst other examples. Further, it is noted that querying can be performed even after a combined zone is determined. The results from such queries can be used to modify inputs to obtain different results.

Combining the Operating Zone

The operating zones generated for each resource can be combined to define a common layout or identify safety zones. In an embodiment, a user, e.g., a layout designer, defines the relationships across the multiple resources. For example, robot A coordinates with robot B to accomplish process X. Then, the resources A and B are related by process X.

In embodiments, these relationships can be used to combine the operating zones. For example, a layout designer can extract the layout for the process X or process Y or common layout for both processes X and Y. The combined zone can be edited by the user by employing the editing the operating zone functionality and querying the operating zone functionality described above.

Figure 3:
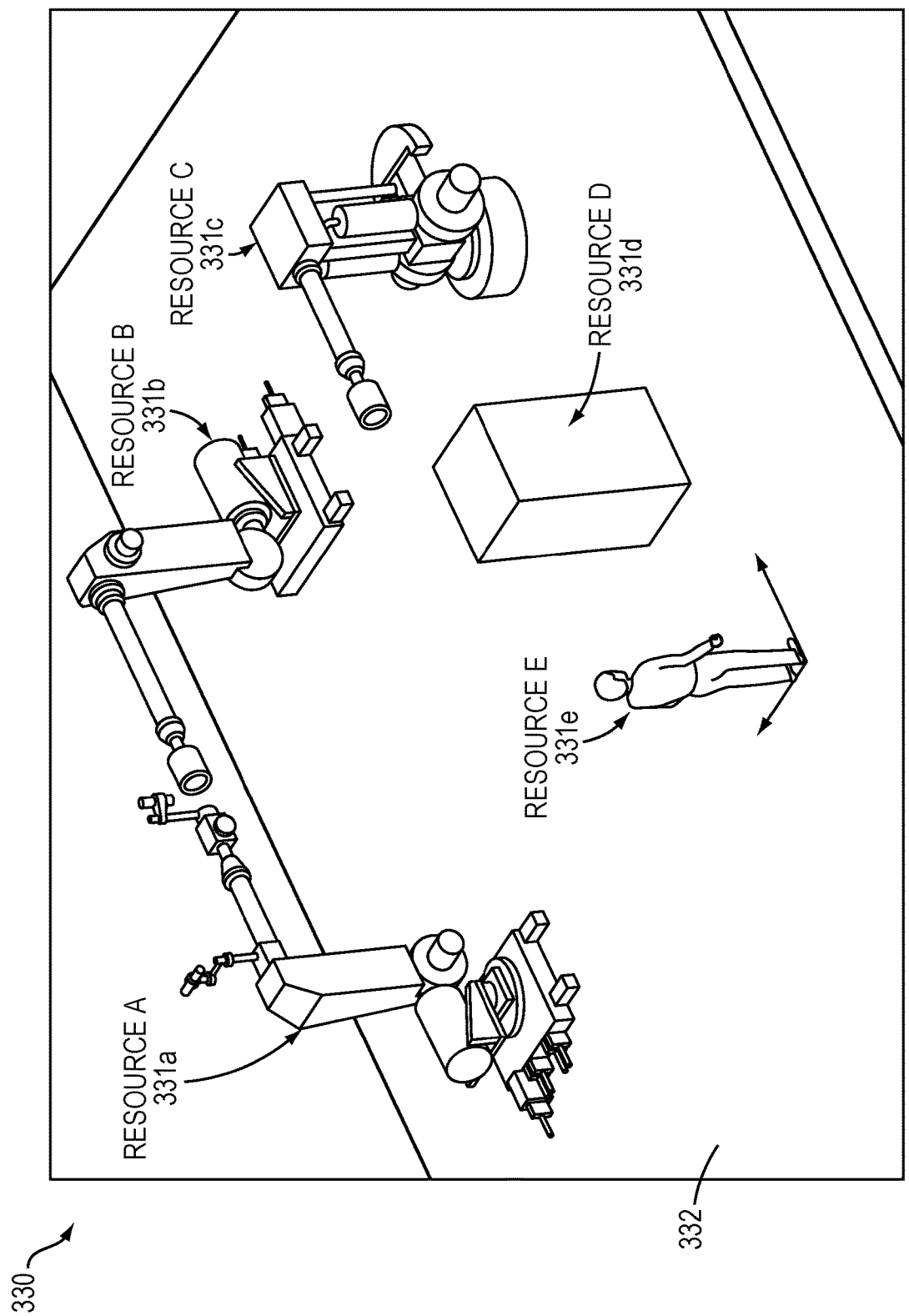
FIG. 3 is a schematic view that depicts resources on a plane for which a layout may be determined using embodiments.

FIG. 3 depicts an environment 330 including the resources 331a-e and the factory floor 332. The resources 331a-c are robots, the resource 331d is a supporting product, e.g., a real-world object being manufactured, and the resource 331e is a human. Using embodiments, a layout for the resources 331a-e on the factory floor 332 may be determined.

In an embodiment, as part of determining a layout of the resources 331a-e, the relationships between the resources 331a-e are defined. FIG. 4 is a simplified diagram illustrating defined relationships between the resources 331a-e. FIG. 4 indicates that resources 331a and 331b are part of process 441, while resources 331c, 331d, and 331e are part of process 442.

Figure 5:
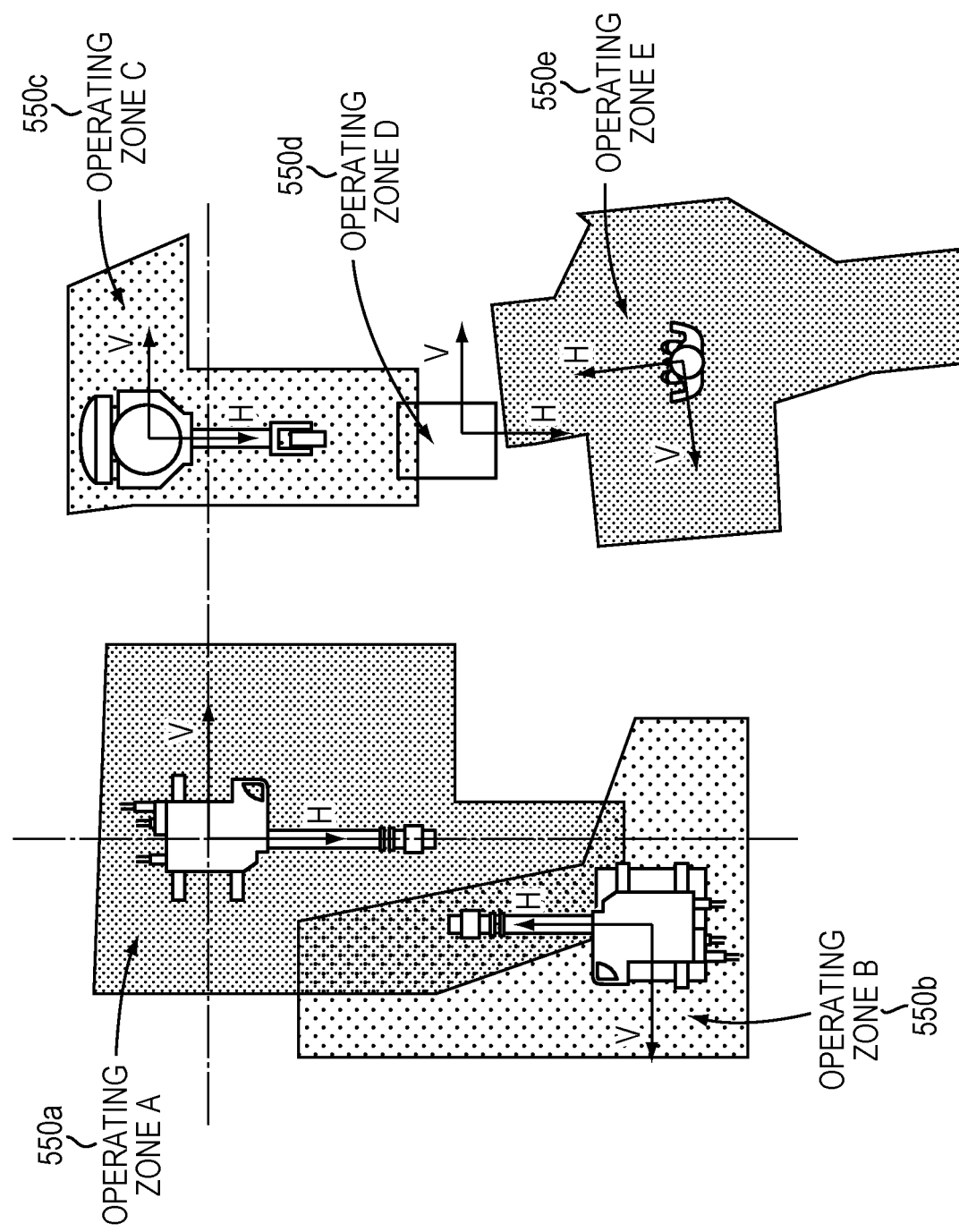
FIG. 5 is a schematic view illustrating resource operating zones that may be determined in embodiments.

In order to determine a layout, embodiments determine the operating zones of each resource. In an embodiment, a user selects (clicks) a "generate operating zone" function implemented as a button or menu selection or the like for each resource 331a-e. In response, a computer implemented method 100, 220 as described herein determines the operating zones for each resource 331a-e. FIG. 5 illustrates the operating zones 550a-e generated for the resources 331a-e, respectively. In an alternative embodiment, once the necessary data, i.e., position and task of each resource is obtained, the operating zone of each resource is determined automatically, i.e., without requiring a user to select (click) a "generate operating zone" function or similar user command.

Figure 6:
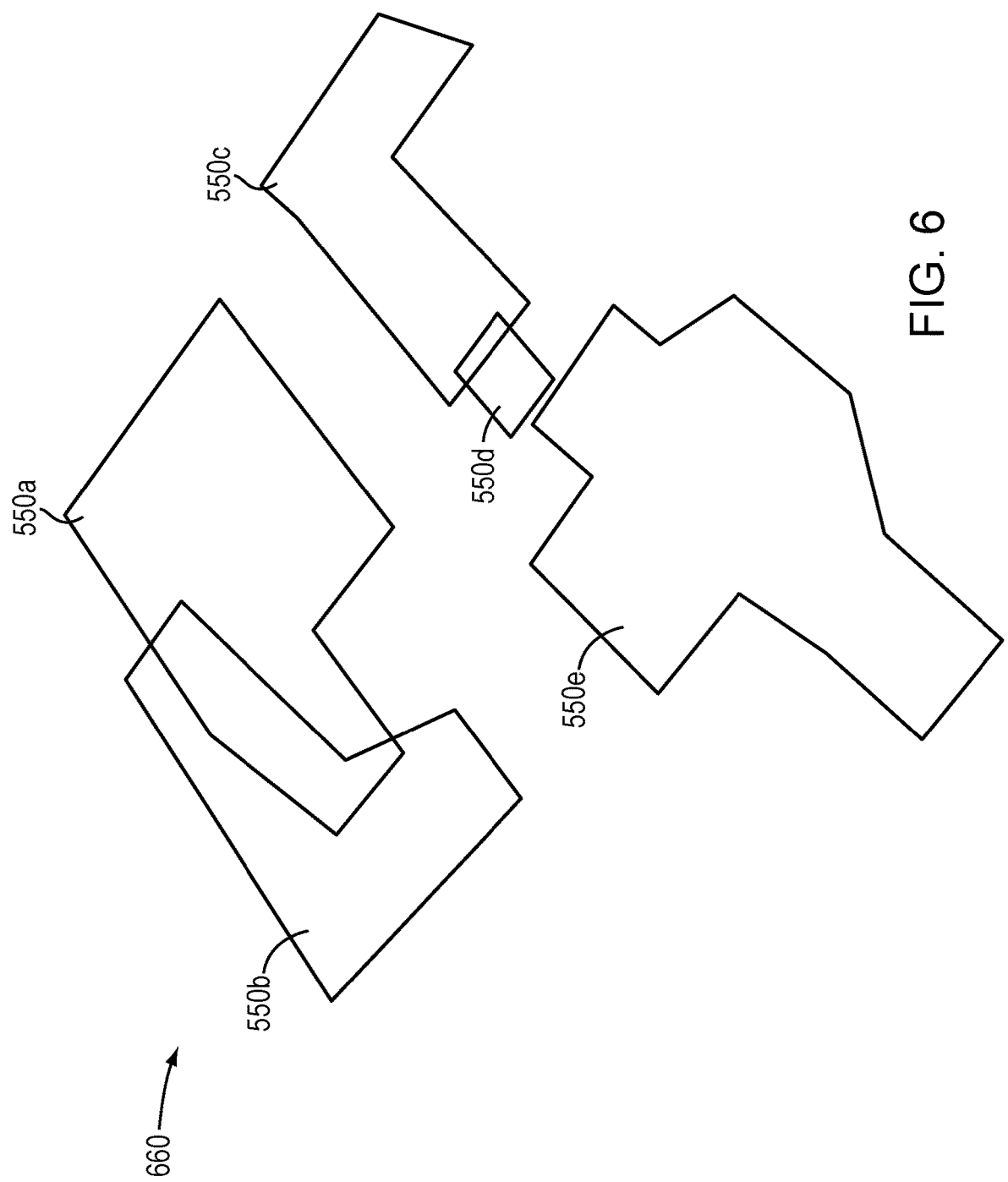
FIG. 6 is a simplified isometric view of the operating zones depicted in FIG. 5.

FIG. 6 is an isometric view 660 of the operating zones 550a-e of FIG. 5.

Using the operating zones and defined relationships between resources, embodiments combine operating zones in order to determine a layout. FIG. 7 illustrates the operating zones 550a-e combined based upon the relationships of resources 331a-e depicted in FIG. 4. FIG. 7 illustrates combining operating zones that are part of common processes 441, 442. Thus, the operating zone 771 is a combination of the operating zones 550a and 550b (corresponding to the resources 331 and 331b which are both part of the process 441), and the operating zone 772 is a combination of the operating zones 550c-e (corresponding to the resources 331c-e which are part of the process 442).

Figure 8:
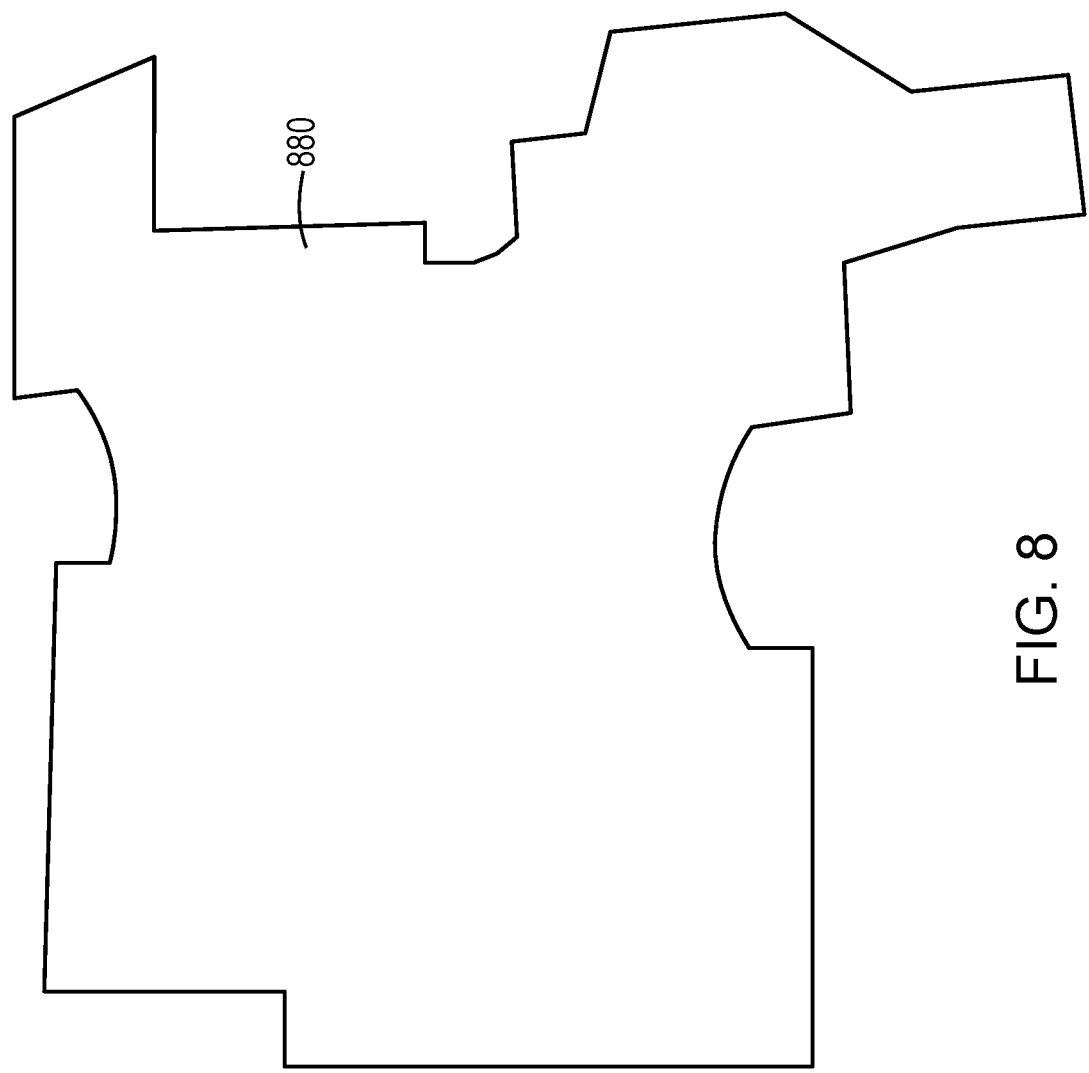
FIG. 8 is an illustration of another combination of the operating zones of FIG. 5 that may be determined using principles of embodiments.

In embodiments, the criteria for combining operating zones may also be changed. For example, a user may change the combination criteria to combine all resources for processes 441 and 442. FIG. 8 illustrates the resulting operating zone 880 that is a combination of the operating zones 550a-e of FIG. 5.

Figure 9:
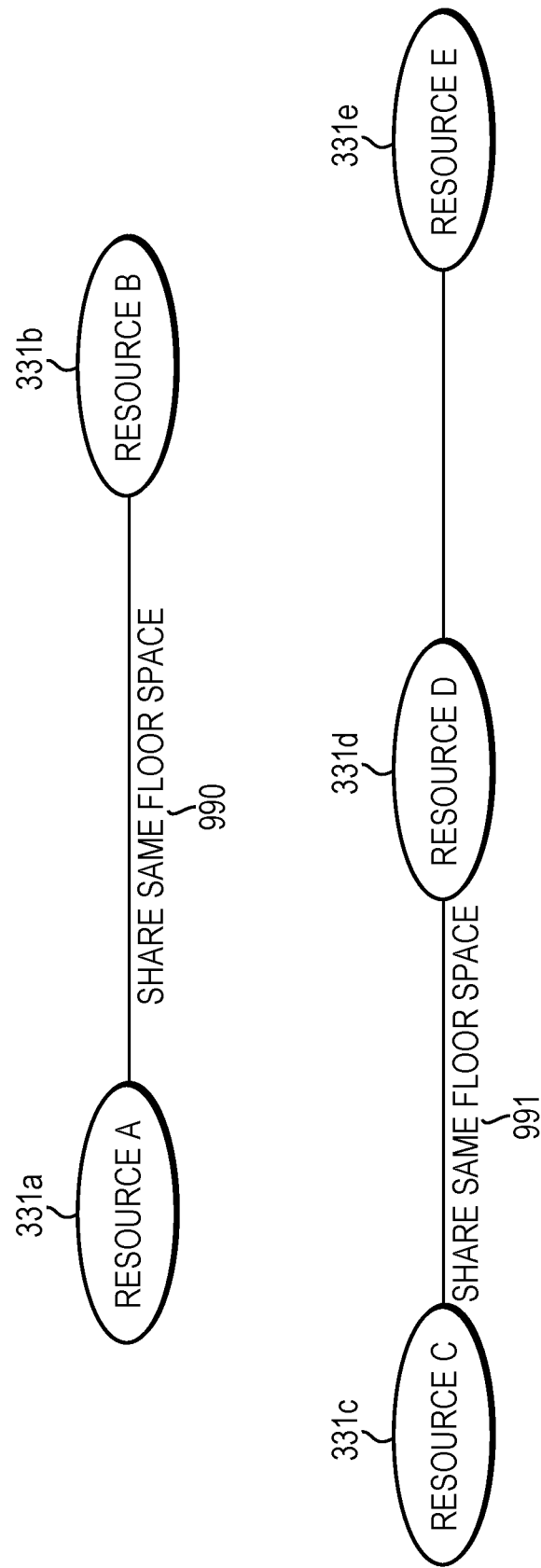
FIG. 9 is a diagram illustrating a relationship between the resources of FIG. 3 that may be considered when combining operating zones of the resources according to embodiments.

In an embodiment, a user can modify the way zones are combined by redefining the relationship among the resources. A user can redefine the relationship among the resources by considering the existence of common overlap across the operating zones, as shown in FIG. 9. For example, if the user indicates that zones should be combined that share common floor space, the relationship among the resources can be redefined as shown in FIG. 9 where the resources 331a and 331b are related by the relationship 990 and the resources 331c and 331d are related by the relationship 991. In FIG. 9, the resource 331e is not related to any of the other resources 331a-b and 331c-d. In addition, it is noted that multiple relationships can be defined between resources.

Figure 10:
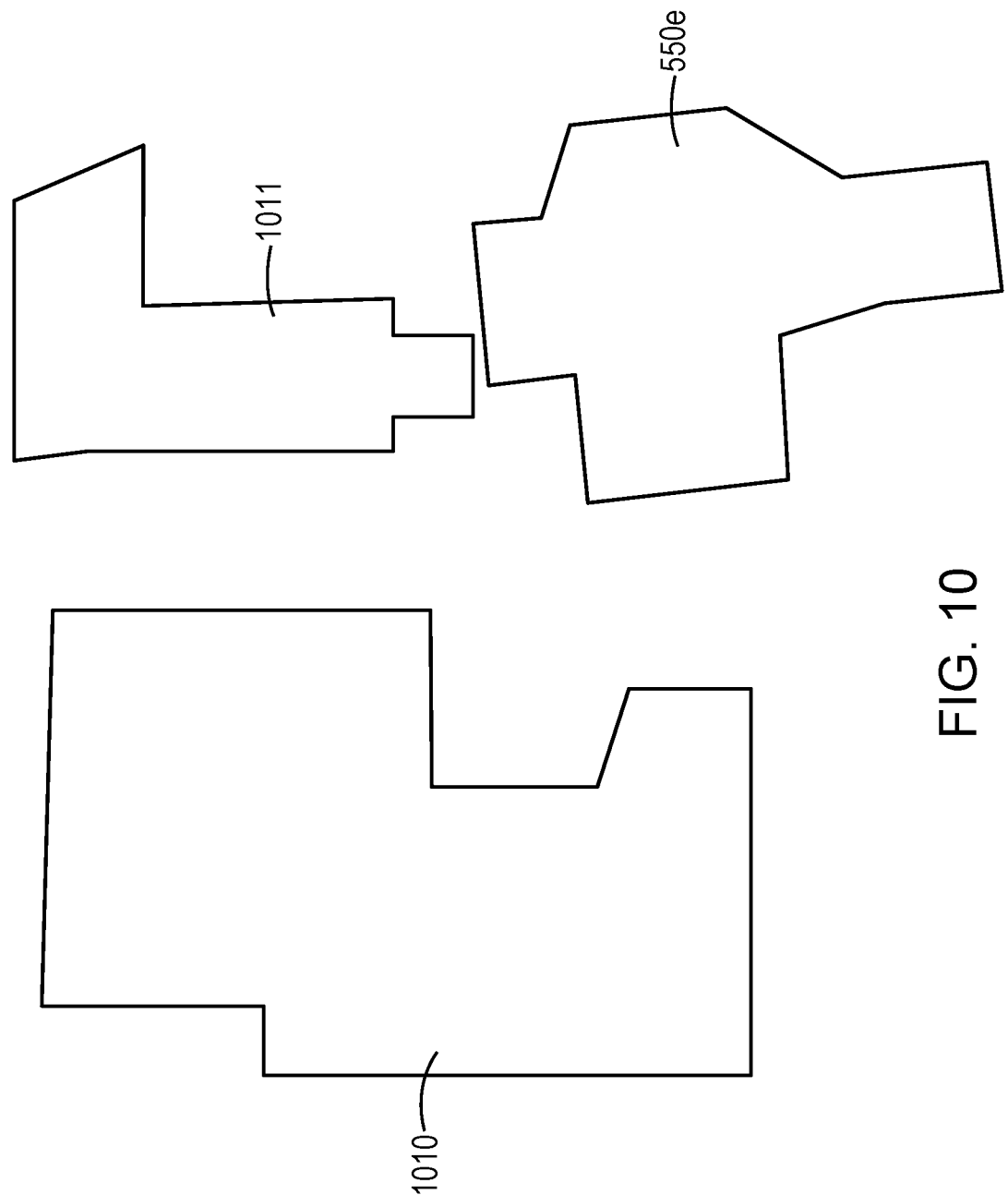
FIG. 10 is a simplified plan view illustrating the operating zones of FIG. 5 combined, using principles of the present invention, based upon the relationships depicted in FIG. 9

FIG. 10 depicts the zones 1010, 1011, and 550e that result from combining the operating zones 550a-e based upon the relationships defined in FIG. 9. The combined zone 1010 is a combination of the original operating zones 550a and 550b of FIG. 5 that have the relationship 990 of FIG. 9. The combined zone 1011 is a combination of the zones 550c and 550d of FIG. 5 that have the relationship 991 of FIG. 9. The original operating zone 550e is not combined with any other operating zones because the zone 550e does not share floor space with any other zone as defined and depicted in FIG. 9.

Figure 11:
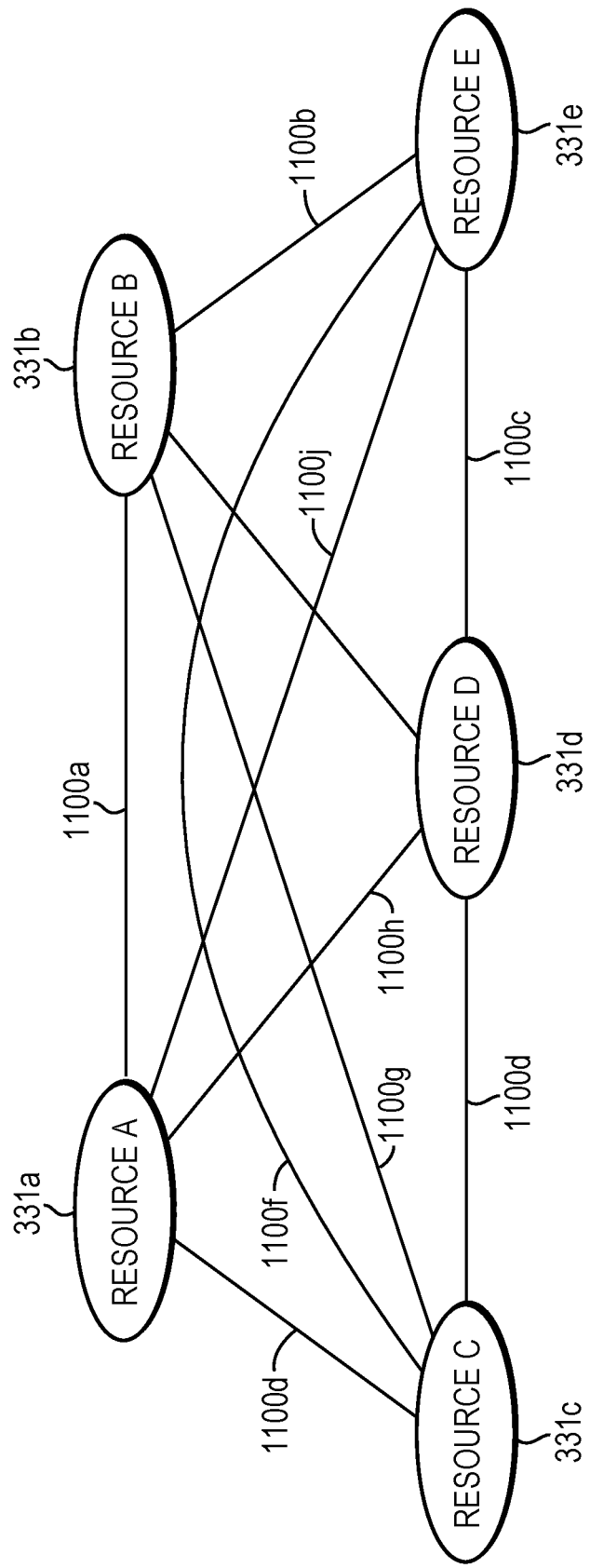
FIG. 11 illustrates relationships between the resources of FIG. 3 defined by proximity.

In embodiments, the relationships between resources can also be based upon proximity. FIG. 11 shows the relationship between the resources 331a-e where the edges 1100a-j denote the proximity relation between the resources 331a-e. In an embodiment, each edge 1100a-j is labelled with the minimum distance between the operating zones corresponding to the resources 331a-e.

Figure 12:
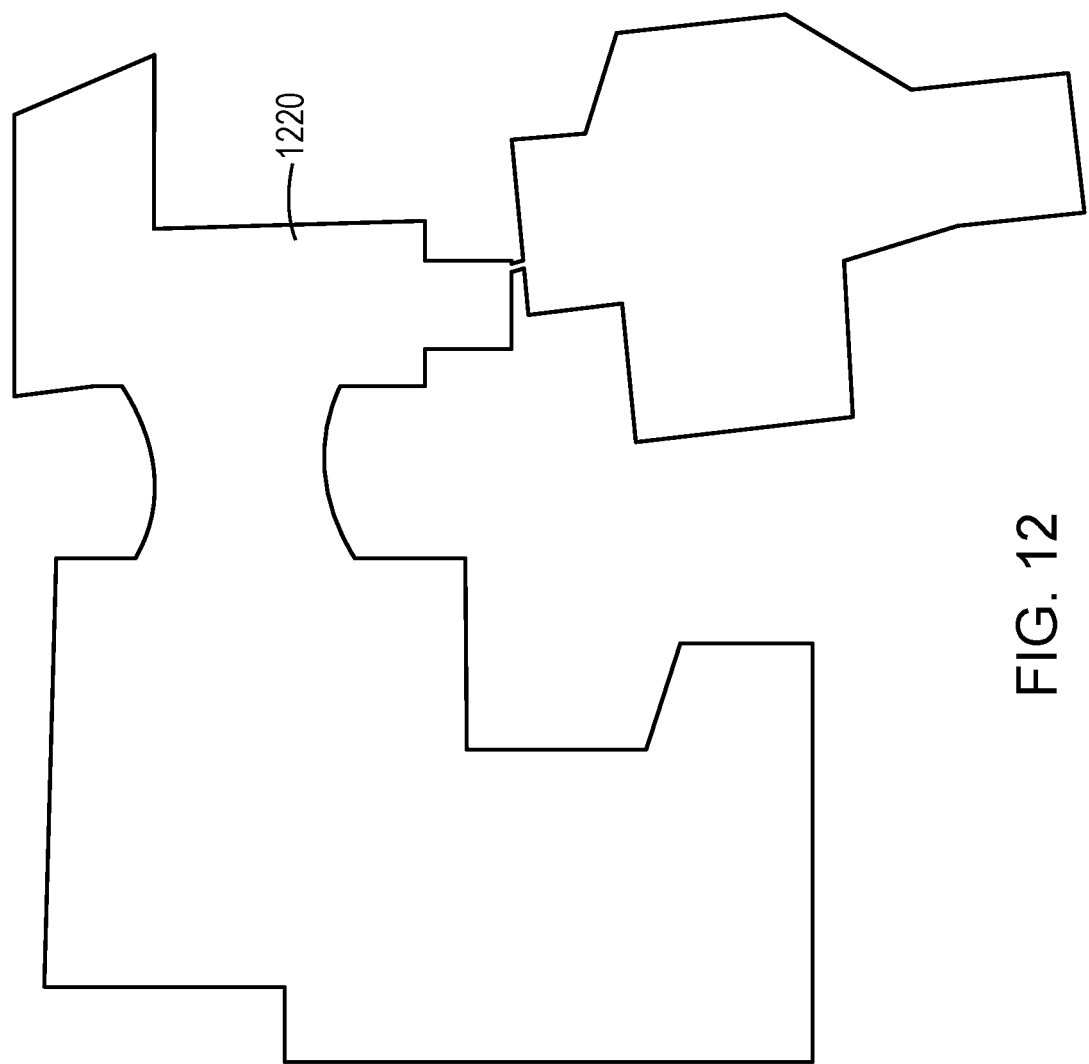
FIG. 12 is a plan view of the operating zones of FIG. 5 combined based upon proximity relationships.

In an embodiment, resources can be combined based on proximity information. For example, in the example of the resources 331a-e, an embodiment may combine operating zones 550a-e with proximity less than or equal to a threshold ($d_{threshold}$), e.g., the distance between resource 331b and the resource 331e. FIG. 12 shows the resulting zone 1220 that results from combining operating zones 550a-e with proximity less than or equal to the distance between the resources 331b and 331e. FIG. 12 shows that the operating zone 550e corresponding to the resource 331e is not directly connected to the operating zones 550a-b corresponding to resources 331a-b.

Computational Approach

Hereinbelow, the computational approach (steps 1-4) for an embodiment is described.

1. Creation of the Operating Zone

In an embodiment, as the user selects the active resource (e.g., robot, human, and/or machine) and clicks "Generate Operating Zone" for the resource, and the user selects the plane of interest, the following internal computation is executed. The task associated with the resource is simulated in software, such as Dassault Systemes 3DEXPERIENCE, which involves the movement of the resource kinematic chains. Each kinematic chain is projected on the given plane as a function of time. This projection generates a set of closed contours over-laid over the given plane. FIG. 13 illustrates the closed contours 1330, which include a plurality of contours, e.g., the contours 1331a, 1331b, 1331c, and 1331n, which are the result of projecting the kinematic chains of a resource on the plane of interest as a function of time. The contours 1330 are combined using a regularized Boolean set operation 1332 [Christoph M. Hoffmann, Geometric and solid modeling: an introduction, Morgan Kaufmann Publishers Inc., San Francisco, Calif., 1989]. The zone 1333 resulting from the Boolean operation 1332 is represented using a boundary representation [Christoph M. Hoffmann, Geometric and solid modeling: an introduction, Morgan Kaufmann Publishers Inc., San Francisco, Calif., 1989] (a virtual representation), which is used as the operating zone for the resource.

According to an embodiment, for inactive resources, like inventory or products, the CAD models of these objects are projected on the given plane, and a boundary representation is constructed out of the projection. In an embodiment, in addition to the boundary representation, another representation (parametric representation) is constructed by approximating the boundary of the virtual representation using B-splines [The NURBS Book. (1996). *Computer-Aided Design*, 28(8), 665-666. doi:10.1016/0010-4485(96) 86819-9], which is used to make local changes in the shape of the operating zone.

2. Editing the Operating Zone

After the operating zones and corresponding virtual representations are generated, an embodiment includes editing the generated operating zones. Editing operating zones may include global editing where a user can prescribe an offset parameter on the operating zone to inflate the operating zone. Editing may also include local editing where a control point on a spline representation of the zone is modified by a user for any local change in the shape of the operating zone. This local editing internally modifies the points on the operating zone by using the variation diminishing property of B-splines.

3. Query the Operating Zone for various properties

In an embodiment, the computational process continues with querying the representation of the operating zones. In such an embodiment, the virtual representation of the operating zone can be queried for data about the operating zones, such as, area and generation of girth, amongst other examples.

4. Combining the Operating Zones

The computational process continues with combining the operating zones. In an embodiment, as the user defines the resources and the relationship across the resources, a graph is constructed with a set of vertices and edges. The vertices store the information about the resource: position and virtual representation of the resource's operating zone, and edges store the relationship across resources. Then, when the operating zones are combined based upon a certain relation, an embodiment traverses the graph and extracts the set of valid vertices and edges satisfying the prescribed relationship to form a sub-graph.

In an embodiment, once zones are evaluated using the criteria and the zones to be combined are identified, the minimum distance is evaluated between one resource and the resources corresponding to the identified operating zones that are going to be combined, (resources being part of the sub-graph constructed in the previous step). For example, FIG. 14 shows N zones (1440a-n), the distance between one zone to all other zones (one-to-many) is shown by the arrows 1441a-i. It is noted that the distance between the same zone is zero.

In an embodiment, the maxima of all these minimum distances ($D_{maxmin}$) is used to automatically combine the valid operating zones (the operating zones to be combined based upon the criteria being used for combination). This is achieved by using a positive offset value: $D_{maxmin}/2+\varepsilon$ and a negative offset of value: $D_{maxmin}/2$, where $\varepsilon$ is a connectivity factor that is very small compared to $D_{maxmin}$. For example, ($\varepsilon/D_{maxmin}=0.0001$) can be used to connect two boundaries. In an embodiment, the corners are rounded during the offset operation to minimize the deviation from the original location of the points on the operating zones. The offset operation internally applies the regularized Boolean set union operation on the set of operating zones. As a result, if two operating zones overlap during offset operation, the zones are combined resulting in a single zone. According to an embodiment, the resulting operating zone can be edited locally and globally as described above.

Figure 15:
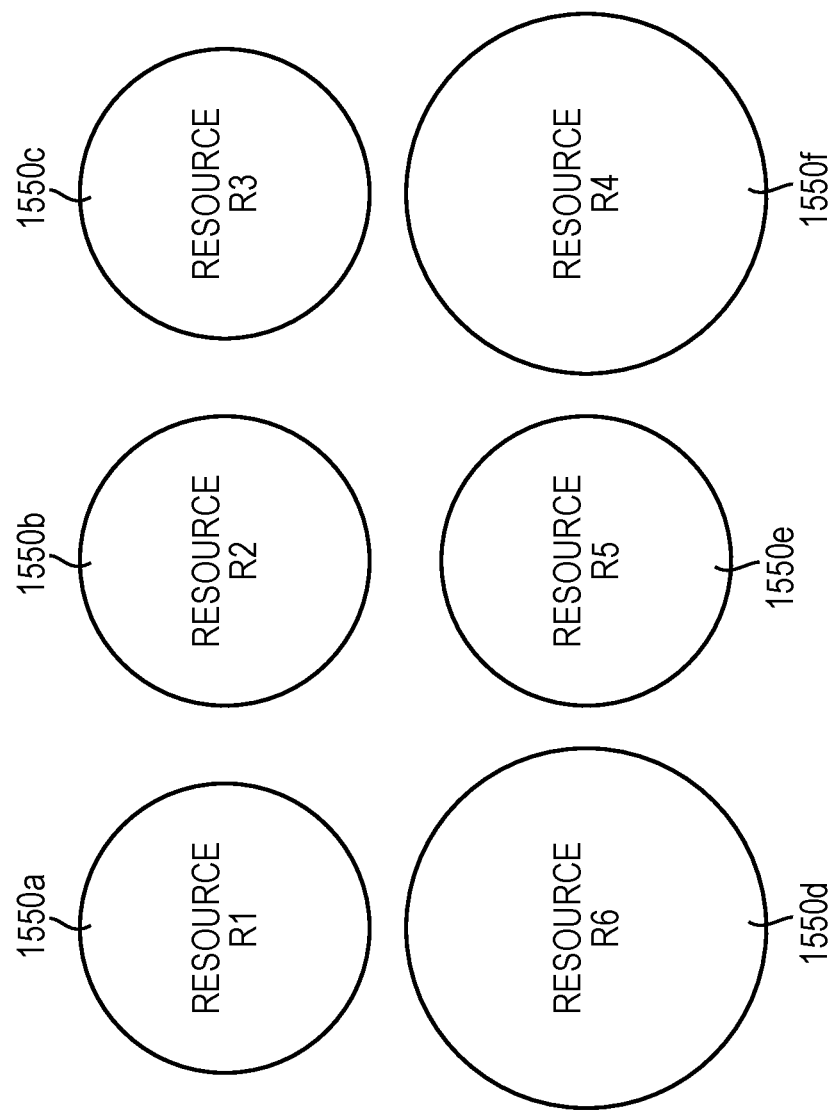
FIG. 15 depicts example circular operating zones for resources that may be combined when determining a layout of the resources.

To illustrate combining operating zones, consider the example of resources with the operating zones 1550a-f illustrated in FIG. 15. To combine the operating zones 1550a-f, a positive offset value is applied to the operating zones 1550a-f, i.e., the operating zones 1550a-f are dilated using the positive offset value which is $D_{maxmin}/2+\varepsilon$. This creates a combined zone. In turn, a negative offset value $D_{maxmin}/2$ is applied to the combined zone, i.e., the combined zone is eroded using the negative offset value.

Figure 16:
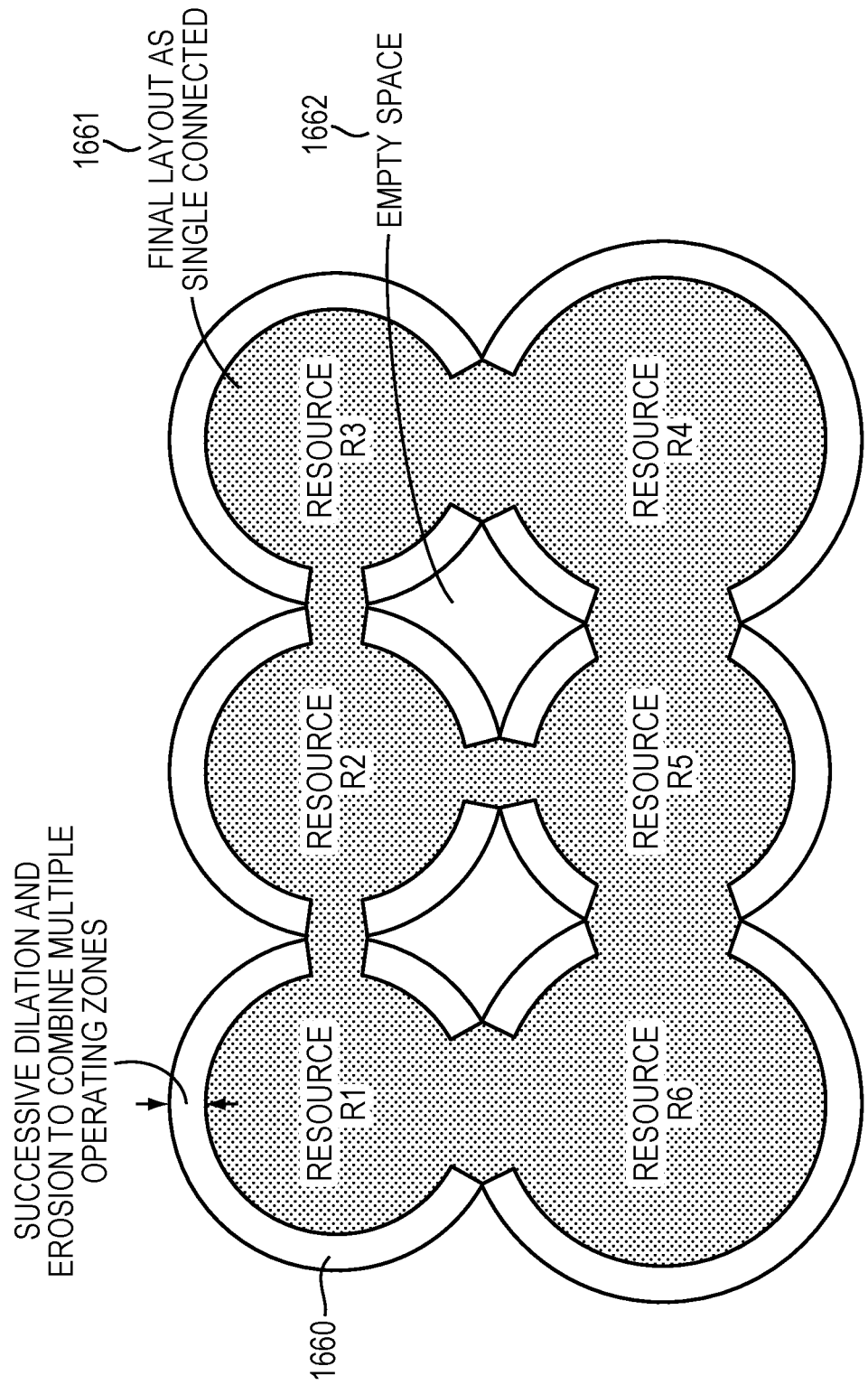
FIG. 16 illustrates the process of expanding and eroding the zones in the example of FIG. 15 to determine a combined zone.

In this example, as the positive offset is applied, the new boundaries of the operating zones 1550a-e will overlap. These new boundaries are combined using a Boolean set union operation to form a single connected-component 1660 depicted in FIG. 16. The negative offset value is applied to the combined zone 1660 to form the final combined zone 1661. In such an embodiment, because the negative offset is slightly less than the positive offset value, such an embodiment retains the original topology. In the example of FIG. 16, the minimum sized combined operating zone is created.

In an embodiment, a layout designer can consider the space left, e.g., the free space 1662, and reuse the empty space for other resources or alter the spatial location of the current resources or redefine the task in order to conserve space.

In an embodiment, as the user clicks, "Generate Operating Zone" for a given resource, a compact virtual representation (two-dimensional representation) is generated for the operating zone, which requires low memory size to store the representation. The generation process is more efficient compared to the method of generating swept volume and then projecting the swept volume to extract the boundary of the operating zone. Also, the resulting zone matches the configuration space of the resources with minimal deviations. In an embodiment, the combination of zones is automatic and it matches the boundary of the individual operating zones with minimal deviations (possibly at concave corners). For example, FIG. 7 shows the combined zones 771, 772, which preserves most of the original vertices and edges of operating (initially generated operating) zones of FIG. 5. Embodiments can be used to save floor space of a factory by allocating required floor space where the robot moves.

While the example described in relation to FIG. 16 depicted generating a minimum sized combined operating zone, it is noted that embodiments are not so limited and, generally, embodiments determine an optimally sized zone, which in certain cases may be a minimally sized zone, while in other cases, the optimally sized zone may be larger than the minimum sized zone. For instance, FIG. 17 graphically depicts combining the zones 1770a and 1770b into the combined zone 1771. The combined zone 1771 is an example of a combined zone where the size of the zone may change based upon preferences and thus, determining a minimally sized zone is not necessary. For example, the width of the track 1772 may be wider or narrower depending upon the application of the resources corresponding to the zones 1770a and 1770b and further, thickness of the track 1772 may vary from one end to the other.

Figure 18B:
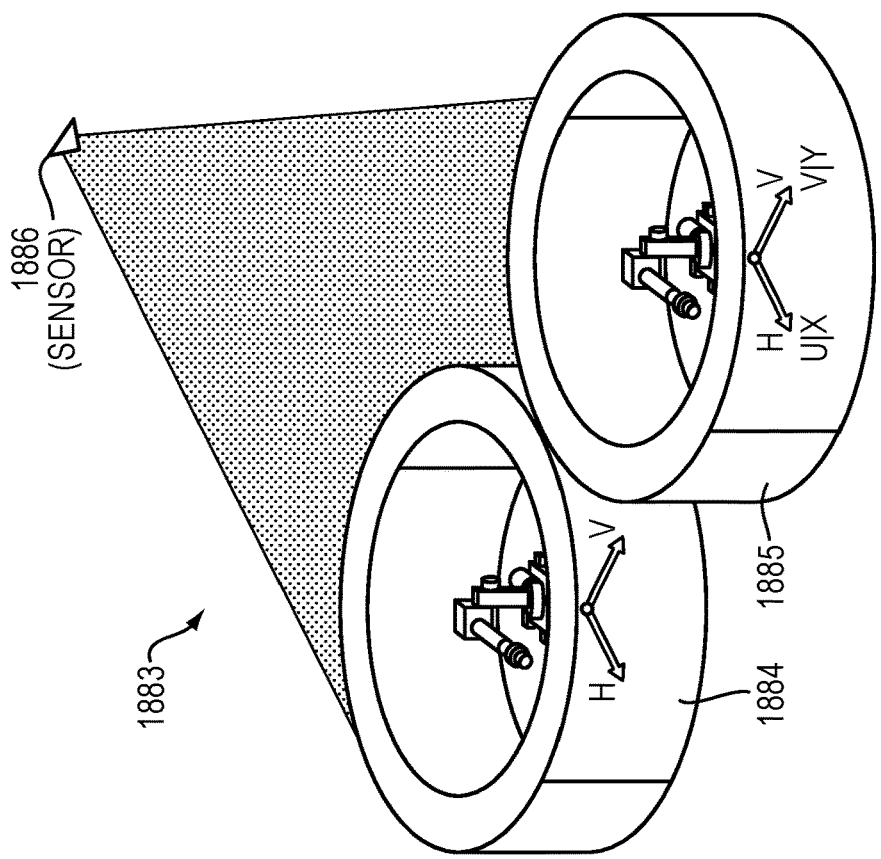
FIGS. 18A-B are schematic views that illustrate resource zones that may be combined according to embodiments.
Figure 18A:
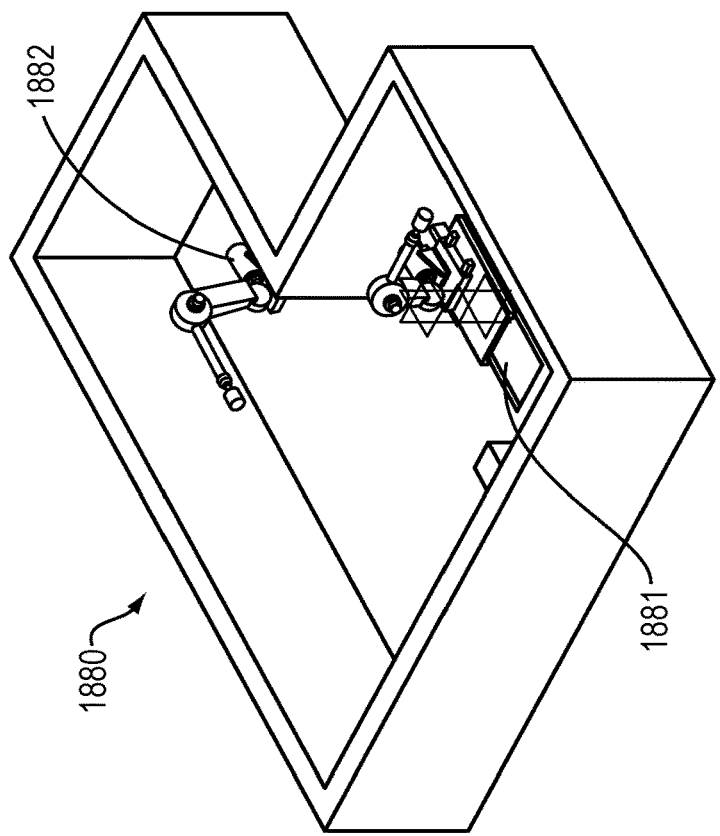

FIG. 18A illustrates an environment 1880 where zones 1881 and 1882 are combined together along their perimeters. In such an example, it may be desired to determine a minimum combined zone so as to conserve floor space. In contrast, FIG. 18B depicts an environment 1883 where boundaries of the operating zones 1884 and 1885 are adjusted based on capabilities of the sensor 1886. As such, in the environment 1883 it may not be desired to determine the minimum sized zone.

Figure 19B:
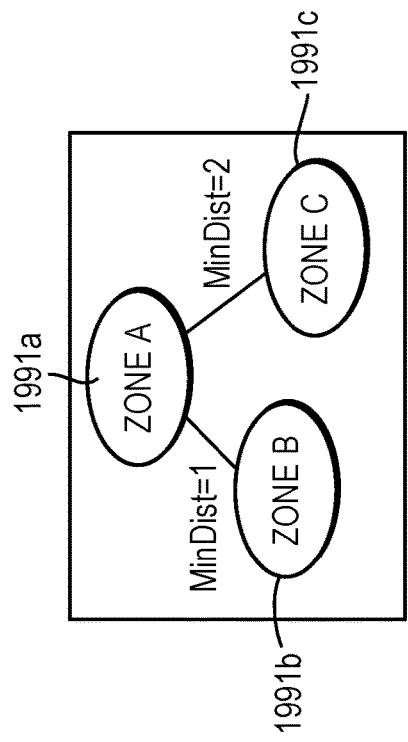
FIGS. 19A-D illustrates zones combined based upon different criteria according to the principles of embodiments.
Figure 19D:
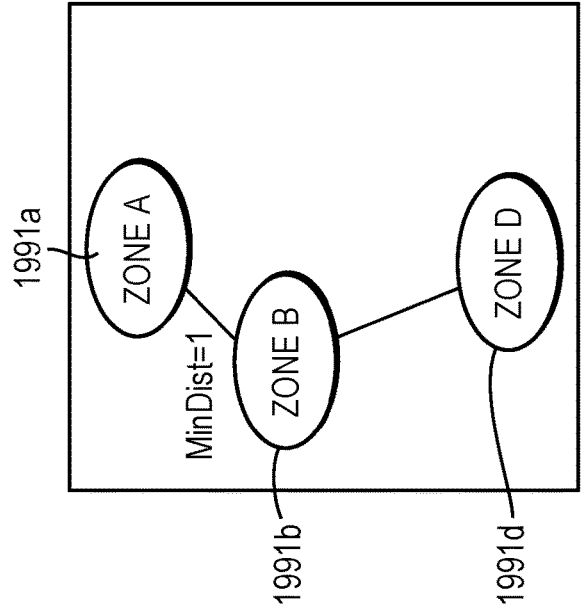
Figure 19A:
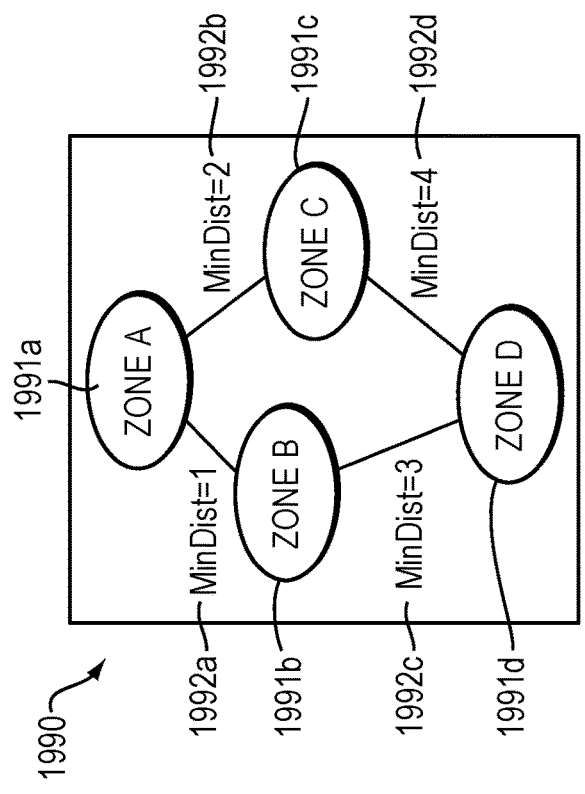
Figure 19C:
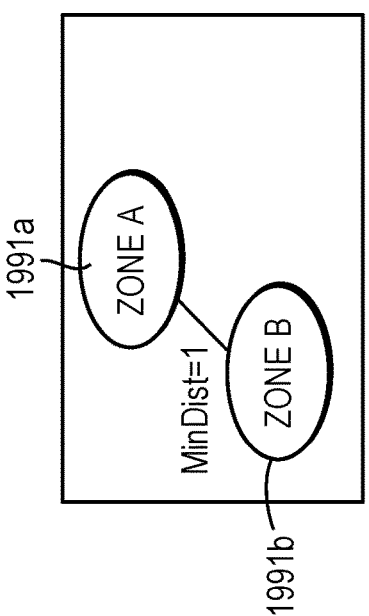

Embodiments may use a plurality of different criteria for combining operating zones. FIG. 19A illustrates an environment 1990 that includes the operating zones 1991a-d with the distances 1992a-d between the operating zones 1991a-d. FIG. 19B illustrates an example where the criteria for combining zones is a distance less than 2 units. In such an example, the zones to be combined are the zones 1991a-c. FIG. 19C illustrates an example where the criteria for combining zones is a distance less than 1 unit. In such an example, the zones to be combined are the zones 1991a-b. FIG. 19D illustrates an example where the criteria for combining zones is a distance less 1 unit as well as zone 1991d. In the example of FIG. 19D, the inclusion of the zone 1991d is an example of a user-specified constraint that may be employed in embodiments.

In embodiments, various layout designs can be generated automatically using high-level user inputs, e.g., proximity information. For instance, in an embodiment, a user can prescribe lower and upper limits for the minimum distance (a<=min-distance<=b) for generating a combined zone. In such an embodiment, the set of candidate zones that satisfy this criterion are automatically selected and combined together.

According to an embodiment, two or more zones of complex shapes, e.g., zones with multiple concavities or holes, can be combined automatically to generate a super zone. In turn, the super zone can be eroded or contracted to generate multiple layouts or zones (or a family of layouts) based on the value chosen for the negative offset value, S where 0<S<=dminmax/2). In such an embodiment, if an offset value of S=dminmax/2 is used, the combined zone preserves features of the outer boundaries of the zones being combined. From these multiple layouts, an optimal solution can be selected automatically (in accordance with a criteria) or can be selected by a user. In an example, a layout is selected based upon a safety factor to ensure the resulting layout is pinch free.

Figure 20:
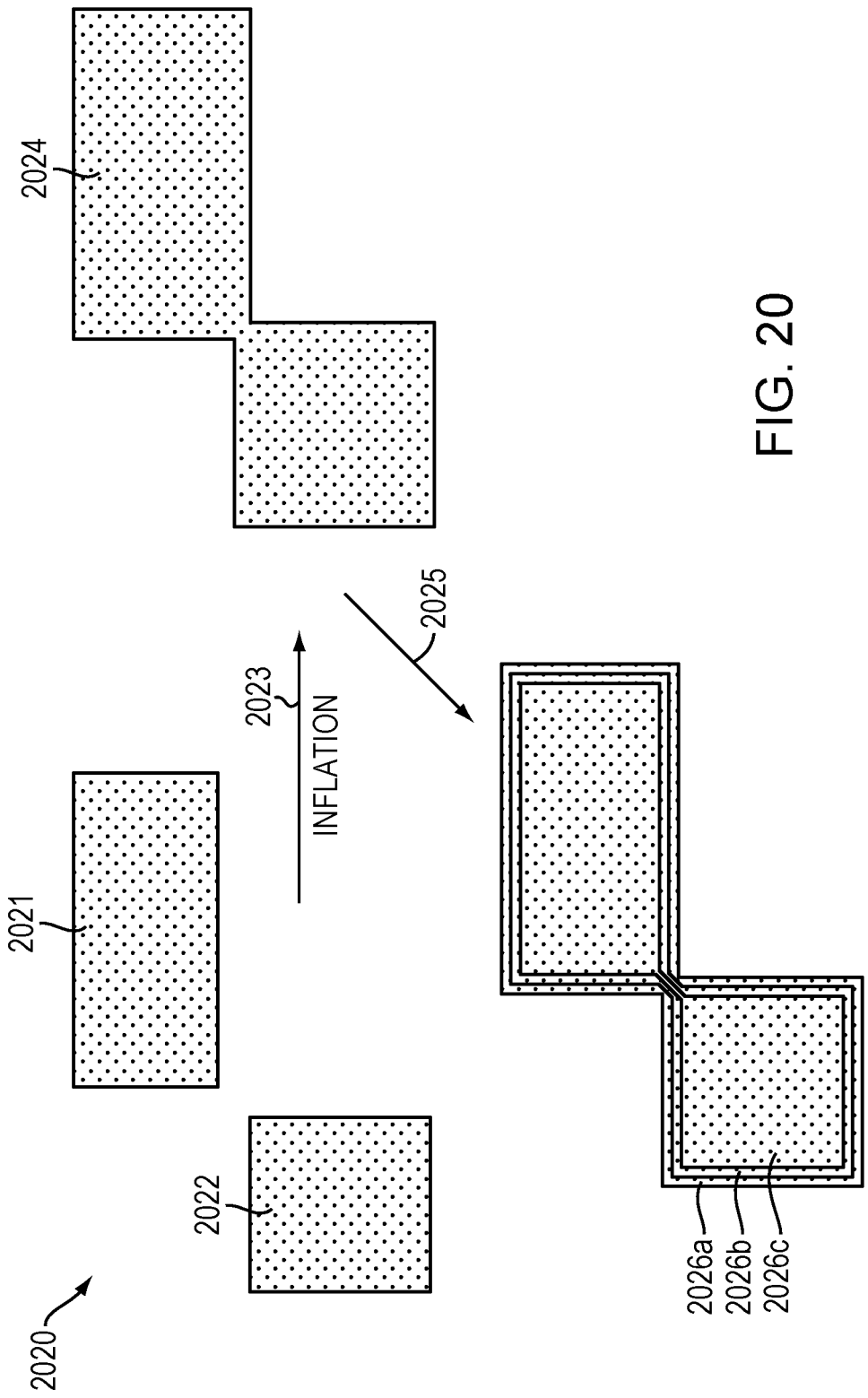
FIG. 20 illustrates the process for inflating zones to determine multiple options of a combined zone.

FIG. 20 illustrates a process 2020 for generating multiple layouts according to an embodiment. The process 2020 begins with the operating zones 2021 and 2022. Next, the operating zones 2021 and 2022 are inflated 2023 to create the combined zone 2024. In turn, the combined zone 2024 is eroded 2025 using multiple different offset values. Each different offset value results in a different layout 2026a-c. An optimal layout can then be selected from the layouts 2026a-c.

Figure 21:
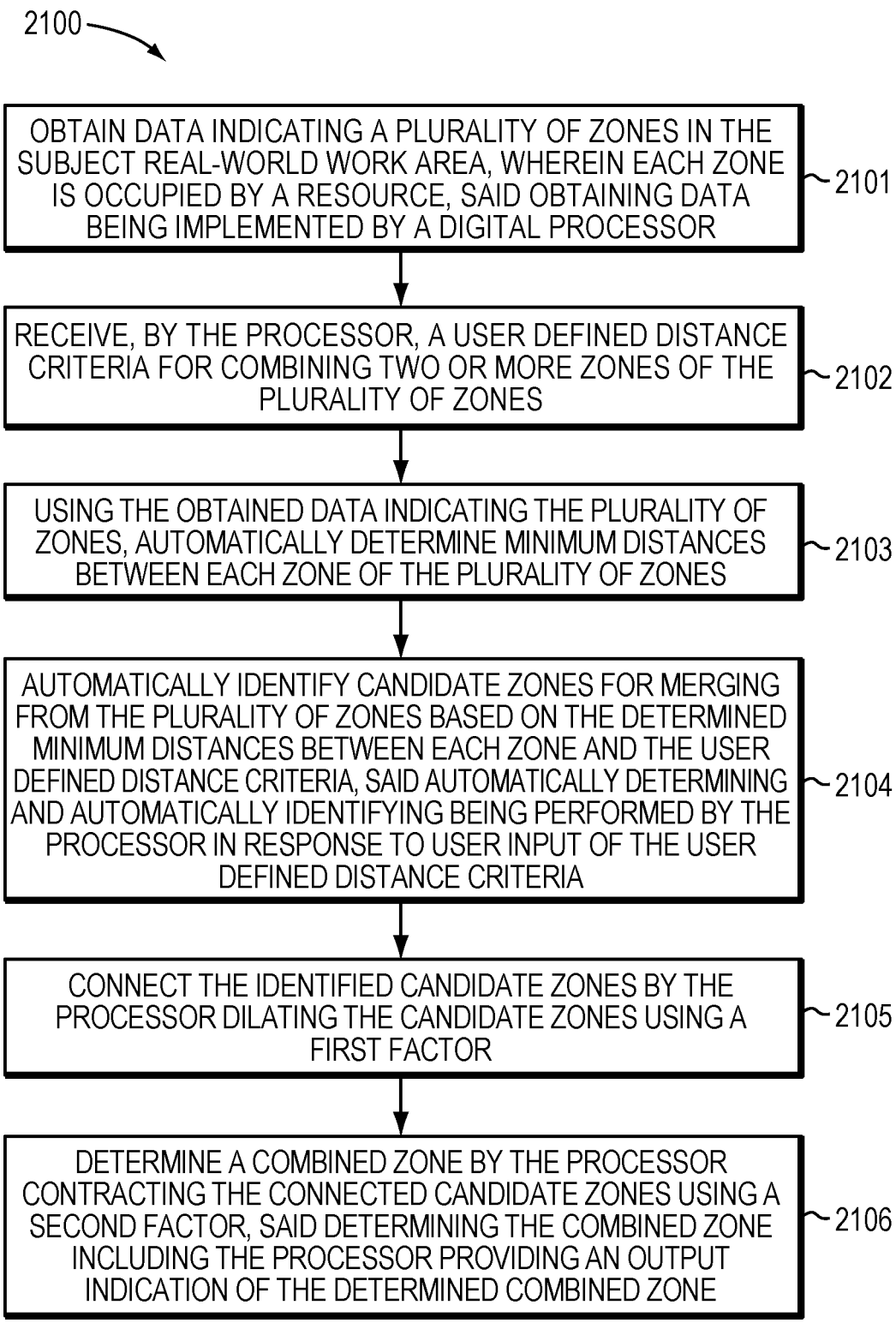
FIG. 21 is a flow diagram of a method for determining a combined industrial work zone encompassing a plurality of resources according to an embodiment.

An embodiment of the invention functions as a "geometric operator." Such an embodiment generates an output automatically based upon high level user inputs. FIG. 21 illustrates such an example method 2100 that functions as a "geometric operator." The method 2100 begins at step 2101 and obtains data indicating a plurality of zones in the subject real-world work area, wherein each zone is occupied by a resource. According an embodiment, the obtaining at step 2101 is implemented by a digital processor. The method 2100 continues at step 2102 by receiving, by the processor, a user defined distance criteria for combining two or more zones of the plurality of zones. In turn, at step 2103, using the obtained data indicating the plurality of zones, minimum distances between each zone of the plurality of zones are automatically determined. Next, at step 2104, candidate zones for merging are automatically identified from the plurality of zones based on the determined minimum distances between each zone and the user defined distance criteria. According to an embodiment, automatically determining the minimum distances at step 2103 and automatically identifying candidate zones at step 2104 is performed by the processor in response to user input of the user defined distance criteria.

To continue, at step 2105 the identified candidate zones are connected by the processor dilating the candidate zones using a first factor. Then, at step 2106 a combined zone is determined by the processor contracting the connected candidate zones using a second factor, where determining the combined zone includes the processor providing an output indication of the determined combined zone. This output indication can be a display view (graphical or model representation) to the user, or can be a data file that is shareable with pertinent related software, e.g., a controller for factory floor elements, such as robots. In an embodiment, the output indication may cause a controller or similar device to reconfigure the factory floor or the operation of resources thereon, e.g., robots, in accordance with the determined layout.

According to an embodiment of the method 2100, the first factor and second factor are each a function of a maximum from a set comprising determined minimum distances between the candidate zones. Another embodiment of the method 2100 further comprises receiving a user defined connectivity factor and, in such an embodiment, the first factor is a function, e.g., a distance function, of a maximum from a set comprising determined minimum distances between the candidate zones and the received user defined connectivity factor. An example embodiment of the method 2100 further comprises receiving one or more user defined constraints on zones to be combined and identifying the candidate zones for merging based on the determined minimum distances between each zone, the user defined distance criteria, and the received one or more user defined constraints on zones to be combined.

Figure 22:
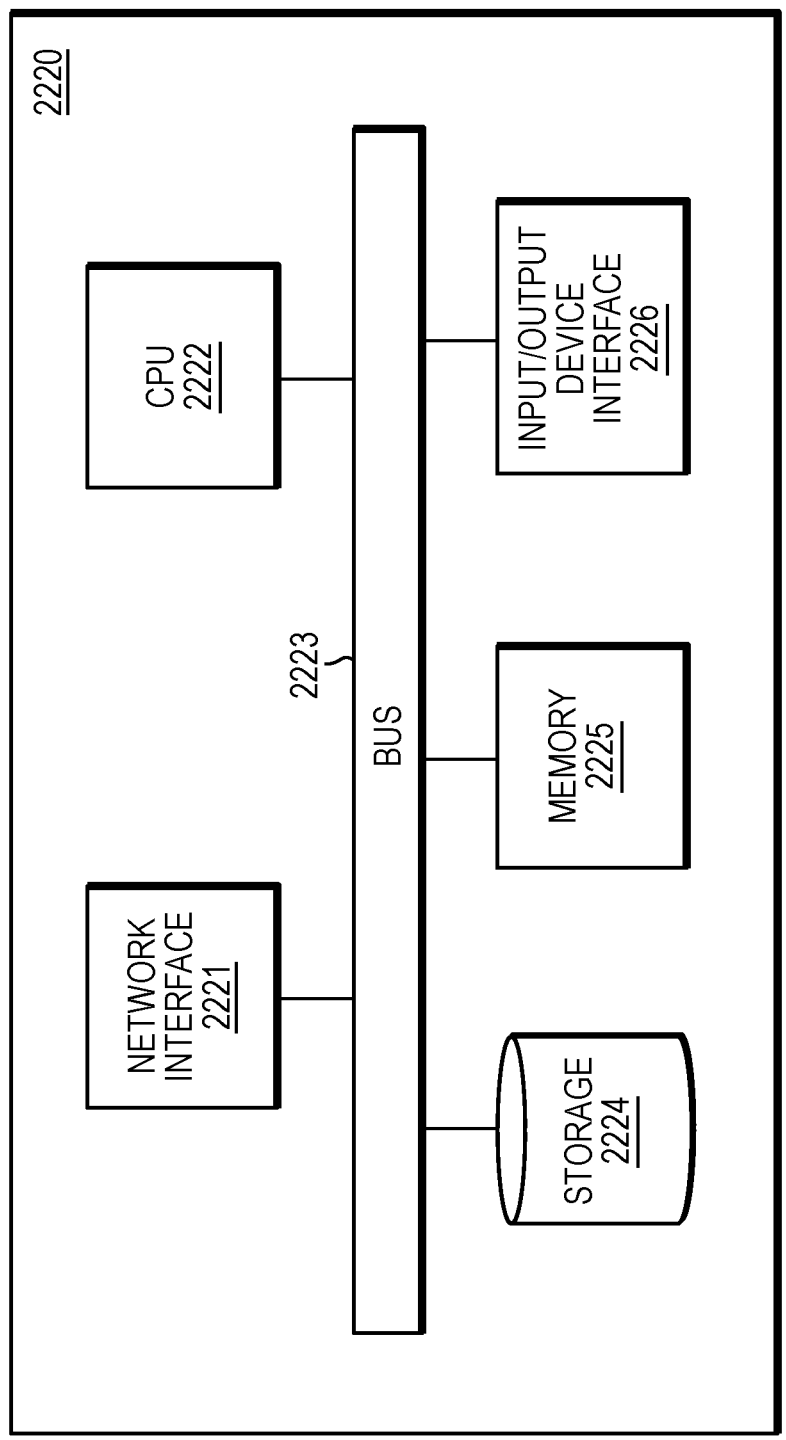
FIG. 22 is a simplified block diagram of a computer system for determining a resource layout according to an embodiment.

FIG. 22 is a simplified block diagram of a computer-based system for determining a resource layout according any variety of the embodiments of the present invention described herein. The system 2220 comprises a bus 2223. The bus 2223 serves as an interconnect between the various components of the system 2220. Connected to the bus 2223 is an input/output device interface 2226 for connecting various input and output devices such as a keyboard, mouse, display, speakers, etc. to the system 2220. A central processing unit (CPU) 2222 is connected to the bus 2223 and provides for the execution of computer instructions implementing embodiments. Memory 2225 provides volatile storage for data used for carrying out computer instructions implementing embodiments described herein, such as those methods 100, 220, 2100 previously described in relation to FIGS. 1, 2, and 21. Storage 2224 provides non-volatile storage for software instructions, such as an operating system (not shown) and embodiment configurations, etc. The system 2220 also comprises a network interface 2221 for connecting to any variety of networks known in the art, including wide area networks (WANs) and local area networks (LANs).

It should be understood that the example embodiments described herein may be implemented in many different ways. In some instances, the various methods and machines described herein may each be implemented by a physical, virtual, or hybrid general purpose computer, such as the computer system 2220, or a computer network environment such as the computer environment 2030, described herein below in relation to FIG. 23. The computer system 2220 may be transformed into the machines that execute the methods described herein, for example, by loading software instructions into either memory 2225 or non-volatile storage 2224 for execution by the CPU 2222. One of ordinary skill in the art should further understand that the system 2220 and its various components may be configured to carry out any embodiments or combination of embodiments of the present invention described herein. Further, the system 2220 may implement the various embodiments described herein utilizing any combination of hardware, software, and firmware modules operatively coupled, internally, or externally, to the system 2220. Further, the system 2220 may be communicatively coupled to or be embedded within a device, so as to control the device or devices connected thereto to operate or move in accordance with a layout determined using the principles described herein.

Figure 23:
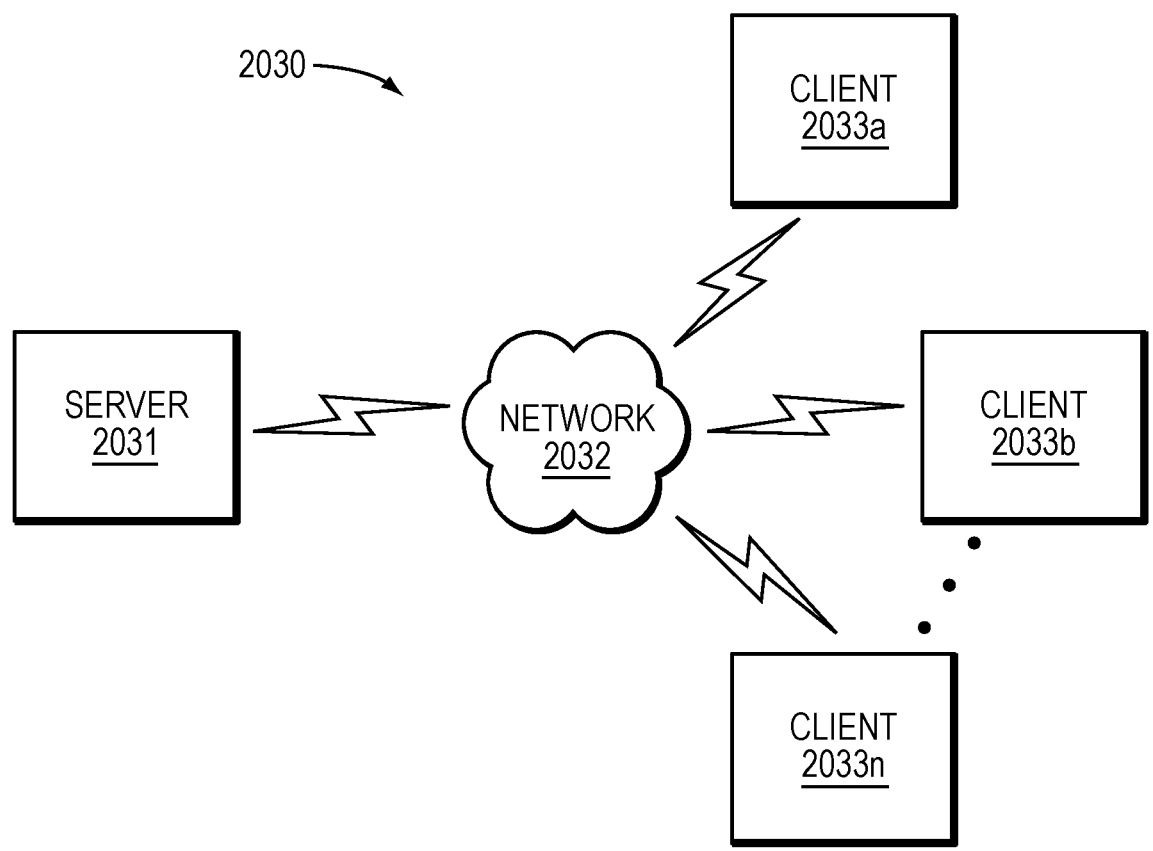
FIG. 23 is a simplified diagram of a computer network environment in which an embodiment of the present invention may be implemented.

FIG. 23 illustrates a computer network environment 2030 in which an embodiment of the present invention may be implemented. In the computer network environment 2030, the server 2031 is linked through the communications network 2032 to the clients 2033a-n. The environment 2030 may be used to allow the clients 2033a-n, alone or in combination with the server 2031, to execute any of the methods described herein. For non-limiting example, computer network environment 2030 provides cloud computing embodiments, software as a service (SAAS) embodiments, and the like.

Embodiments or aspects thereof may be implemented in the form of hardware, firmware, or software. If implemented in software, the software may be stored on any non-transient computer readable medium that is configured to enable a processor to load the software or subsets of instructions thereof. The processor then executes the instructions and is configured to operate or cause an apparatus to operate in a manner as described herein.

Further, firmware, software, routines, or instructions may be described herein as performing certain actions and/or functions of the data processors. However, it should be appreciated that such descriptions contained herein are merely for convenience and that such actions in fact result from computing devices, processors, controllers, or other devices executing the firmware, software, routines, instructions, etc.

It should be understood that the flow diagrams, block diagrams, and network diagrams may include more or fewer elements, be arranged differently, or be represented differently. But it further should be understood that certain implementations may dictate the block and network diagrams and the number of block and network diagrams illustrating the execution of the embodiments be implemented in a particular way.

Accordingly, further embodiments may also be implemented in a variety of computer architectures, physical, virtual, cloud computers, and/or some combination thereof, and thus, the data processors described herein are intended for purposes of illustration only and not as a limitation of the embodiments.

While example embodiments have been particularly shown and described, it will be understood by those skilled in the art that various changes in form and details may be made therein without departing from the scope of the embodiments encompassed by the appended claims.

What is claimed is:

1. A computer-implemented method of automatically determining a resource layout, the method comprising:
   obtaining data indicating a position and a task performed by each resource of a plurality of resources;
   for each resource of the plurality, automatically determining a respective zone on a plane of interest occupied by the resource over time using the obtained data indicating the position and the task performed by the resource;
   expanding and eroding, automatically based upon criteria, determined zones of two or more resources of the plurality of resources to form a combined zone; and
   automatically creating a file indicating a layout of the plurality of resources on the plane of interest based upon the determined zones and the combined zone.

2. The method of claim 1 wherein determining a respective zone for the resource includes:
   simulating the resource performing the task indicated in the obtained data for the resource;
   projecting components of the resource over time to produce closed contours of the resource on the plane of interest; and
   combining the contours into the zone using a regularized Boolean set operation.

3. The method of claim 1 further comprising:
indicating safety zones in the layout.

4. The method of claim 1 wherein expanding and eroding combining the determined zones of the two or more resources includes:
determining an optimally sized zone encompassing the zones of the two or more resources, the optimally sized zone being the combined zone.

5. The method of claim 4 wherein determining the optimally sized zone includes:
expanding and eroding the zones of the two or more zones using a first factor and a second factor to form the optimally sized zone.

6. The method of claim 5 wherein the first factor and the second factor are each a function of a maximum from a set comprising minimum distances between the two or more zones.

7. The method of claim 5 wherein the expanding and eroding includes:
expanding the zones of the two or more zones using the first factor to form expanded zones;
combining the expanded zones to form a super-zone; and
eroding the super-zone using the second factor to form the optimally sized zone.

8. The method of claim 1 wherein the criteria includes a negative offset value and the method further comprises:
determining a plurality of respective combined zones by expanding and eroding the determined zones of the two or more resources using a plurality of different negative offset values; and
selecting, based upon a safety factor, a given combined zone from the determined plurality of combined zones for creating the file indicating the layout.

9. The method of claim 1 wherein the criteria is at least one of: distance between zones, a user defined constraint, and a task performed by a resource of the two or more zones.

10. The method of claim 9 wherein the distance between zones includes a lower limit and an upper limit for distance between zones to be combined.

11. The method of claim 9 wherein the expanding and eroding based on the criteria includes:
from the determined zones, selecting, based on at least one of the criteria, candidate zones of the two or more resources for combining;
applying the criteria to the candidate zones to identify the determined zones of the two or zones to combine; and
expanding and eroding the identified zones of the two or more zones to form the combined zone.

12. The method of claim 11 wherein the user defined constraint includes inclusion of a particular zone into the candidate zones.

13. The method of claim 1 wherein a given resource of the plurality of resources is at least one of: an industrial resource, a robot, a human, a machine tool, and a fixture.

14. The method of claim 1 wherein the plane of interest is a factory floor.

15. A system for automatically determining a resource layout, the system comprising:
a processor; and
a memory with computer code instructions stored thereon, the processor and the memory, with the computer code instructions, being configured to cause the system to:
obtain data indicating a position and a task performed by each resource of a plurality of resources;
for each resource of the plurality, automatically determine a respective zone on a plane of interest occupied by the resource over time using the obtained data indicating the position and the task performed by the resource;
expand and erode, automatically based upon criteria, determined zones of two or more resources of the plurality of resources to form a combined zone; and
automatically create a file indicating a layout of the plurality of resources on the plane of interest based upon the determined zones and the combined zone.

16. A non-transitory computer program product for automatically determining a resource layout, the computer program product executed by a server in communication across a network with one or more clients and comprising:
a computer readable medium, the computer readable medium comprising program instructions, which, when executed by a processor, causes the processor to:
obtain data indicating a position and a task performed by each resource of a plurality of resources;
for each resource of the plurality, automatically determine a respective zone on a plane of interest occupied by the resource over time using the obtained data indicating the position and the task performed by the resource;
expand and erode, automatically based upon criteria, determined zones of two or more resources of the plurality of resources to form a combined zone; and
automatically create a file indicating a layout of the plurality of resources on the plane of interest based upon the determined zones and the combined zone.

17. A computer-implemented method of determining a combined industrial work zone encompassing a plurality of resources, the method comprising:
in response to user interaction with a CAD model representation of a subject real-world work area:
obtaining data indicating a plurality of zones in the subject real-world work area, wherein each zone is occupied by a resource, said obtaining data being implemented by a digital processor;
receiving, by the processor, a user defined distance criteria for combining two or more zones of the plurality of zones;
using the obtained data indicating the plurality of zones, automatically determining minimum distances between each zone of the plurality of zones;
automatically identifying candidate zones for merging from the plurality of zones based on the determined minimum distances between each zone and the user defined distance criteria, said automatically determining and automatically identifying being performed by the processor in response to user input of the user defined distance criteria;
connecting the identified candidate zones by the processor dilating the candidate zones using a first factor; and
determining a combined zone by the processor contracting the connected candidate zones using a second factor, said determining the combined zone including the processor providing an output indication of the determined combined zone.

18. The method of claim 17 wherein the first factor and second factor are each a function of a maximum from a set comprising determined minimum distances between the candidate zones.

19. The method of claim 17 further comprising:
receiving a user defined connectivity factor; and
wherein, the first factor is a function of a maximum from a set comprising determined minimum distances between the candidate zones and the received user defined connectivity factor.

20. The method of claim 17 further comprising:
receiving one or more user defined constraints on zones to be combined; and
identifying the candidate zones for merging based on the determined minimum distances between each zone, the user defined distance criteria, and the received one or more user defined constraints on zones to be combined.

\* \* \* \* \*

UNITED STATES PATENT AND TRADEMARK OFFICE
CERTIFICATE OF CORRECTION

| | |
|---|---|
| PATENT NO. | : 11,409,924 B2 |
| APPLICATION NO. | : 16/541699 |
| DATED | : August 9, 2022 |
| INVENTOR(S) | : Gaurav Kumar Sharma and Anoop Kishor |

It is certified that error appears in the above-identified patent and that said Letters Patent is hereby corrected as shown below:

In the Claims

In Claim 4, Column 23, Line 4, delete "combining the determined" and insert -- the determined --.

Signed and Sealed this
Eleventh Day of October, 2022

Katherine Kelly Vidal
*Director of the United States Patent and Trademark Office*